United States Patent
Hamilton

(10) Patent No.: US 10,833,687 B1
(45) Date of Patent: Nov. 10, 2020

(54) DIGITAL TO ANALOG CIRCUIT

(71) Applicant: Dialog Semiconductor (UK) Limited, London (GB)

(72) Inventor: Joseph Hamilton, Edinburgh (GB)

(73) Assignee: Dialog Semiconductor (UK) Limited, London (GB)

(*) Notice: Subject to any disclaimer, the term of this patent is extended or adjusted under 35 U.S.C. 154(b) by 0 days.

(21) Appl. No.: 16/442,653

(22) Filed: Jun. 17, 2019

(51) Int. Cl.
  *H03M 1/66* (2006.01)
  *H03M 1/00* (2006.01)
  *H03F 3/181* (2006.01)

(52) U.S. Cl.
  CPC ............ *H03M 1/002* (2013.01); *H03F 3/181* (2013.01); *H03M 1/66* (2013.01)

(58) Field of Classification Search
  CPC ........ H03M 1/002; H03M 1/68; H03M 1/068; H03M 1/1028; H03M 1/1047; H03M 1/74; H03M 1/80; H03M 1/00; H03M 1/007; H03M 1/06; H03M 1/38; H03M 1/66; H03M 1/747; H03M 3/30; H03M 3/32; H03M 3/426; H03M 3/436; H03M 3/464; H03M 3/51
  USPC .................................................. 341/143–145
  See application file for complete search history.

(56) References Cited

U.S. PATENT DOCUMENTS

| | | | | |
|---|---|---|---|---|
| 5,590,155 A | * | 12/1996 | Yasuda | H04L 27/2092 332/103 |
| 6,697,004 B1 | * | 2/2004 | Galton | H03M 1/066 341/143 |
| 6,727,832 B1 | * | 4/2004 | Melanson | H03M 3/372 341/143 |
| 8,842,034 B1 | * | 9/2014 | Gong | H03M 1/68 341/144 |
| 9,735,799 B1 | * | 8/2017 | Nguyen | H03M 1/06 |
| 9,966,969 B1 | * | 5/2018 | Engel | H03M 1/66 |
| 2006/0255992 A1 | * | 11/2006 | Sakiyama | H03M 3/366 341/143 |
| 2011/0074613 A1 | * | 3/2011 | Newman | H03M 1/0665 341/143 |
| 2016/0182080 A1 | * | 6/2016 | Vasani | H03M 1/1028 341/145 |

* cited by examiner

*Primary Examiner* — Linh V Nguyen
(74) *Attorney, Agent, or Firm* — Saile Ackerman LLC; Stephen B. Ackerman

(57) ABSTRACT

A method and associated system have been proposed to achieve power savings in PWM DACs by truncating PWM sequences and maximizing the amount of time available to power up a DAC cell without sacrificing sensitivity to element mismatch. The DAC circuit includes a driver to receive a digital input and to provide a plurality of drive sequences, a digital-to-analog converter, and a controller. The digital-to-analog converter includes an array of digital-to-analog elements operable over several time steps. Upon identifying that the digital signal is below a threshold value, the controller is configured to shorten the drive sequences; and for each time step to identify a first set of elements and a second set of elements among the array of digital-to-analog elements; to apply the shortened drive sequences to the first set; to disable the second set; and to shift the first set and the second set by one element.

24 Claims, 19 Drawing Sheets

| Avg. ΣΔM Out | Num. PDAC Elements Outputting+1/128 | Num. PDAC Elements Outputting-1/128 | Num. NDAC Elements Outputting+1/128 | Num. NDAC Elements Outputting-1/128 | Num. Unnecessary Elements |
|---|---|---|---|---|---|
| +1 | 64 | 0 | 0 | 64 | 0 |
| ... | ... | ... | ... | ... | ... |
| +2/32 | 34 | 30 | 30 | 34 | 30 |
| +1/32 | 33 | 31 | 31 | 33 | 31 |
| 0 | 32 | 32 | 32 | 32 | 32 |
| -1/32 | 31 | 33 | 33 | 31 | 31 |
| ... | ... | ... | ... | ... | ... |
| -1 | 0 | 64 | 64 | 0 | 0 |

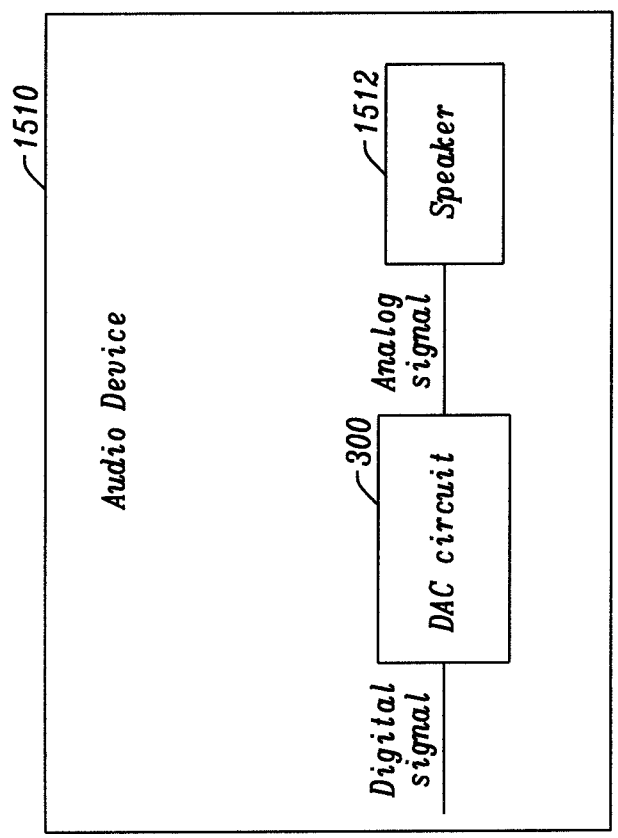

DIGITAL TO ANALOG CIRCUIT

TECHNICAL FIELD

The present disclosure relates to a digital to analog circuit. In particular, the present disclosure relates to a digital to analog circuit operable in a low power mode.

BACKGROUND

Audio devices demand a high dynamic range combined with a low harmonic distortion. These requirements often lead to devices having relatively large power consumption. Audio output architectures may be implemented in different fashions. A common approach is based on modulating an input digital signal with a digital pulse-width modulator to drive a series of DACs.

Most DAC topologies are composed of multiple DAC elements, which may be either identical or scaled versions of each other. The outputs of these DAC elements are summed together to produce an analog output based on a digital input code. When considering an A-weighted dynamic range (DR) of 112 dB or above, a DAC made of current elements (IDAC) or resistor elements (RDAC) is often preferred over a DAC made of switched capacitor elements. This is due to the area penalty of accurate capacitors and the need to have an external reservoir capacitor for switched-capacitor DACs. However, current and resistor DACs introduce a small error in their output whenever their input code changes, which may degrade DAC linearity. This can occur when the change in input code is signal-dependent, as is the case for example for systems that employ data weighted averaging (DWA) to reduce the effects of DAC element mismatch. For current and resistor DACs, pulse-width modulation (PWM) of the input signal is a common technique to achieve high linearity. While the PWM DAC technique provides an analog output that varies linearly with the input digital signal, its minimum power consumption is still set by the desired dynamic range. The DAC power consumption also increases with increased dynamic range. For example, in order to achieve a 3 dB increase in dynamic range the DAC power must be at least doubled. It is an object of the disclosure to address one or more of the above-mentioned limitations.

SUMMARY

According to a first aspect of the disclosure, there is provided a method of converting a digital signal into an analog signal, the method comprising providing a digital-to-analog converter comprising an array of digital-to-analog elements operable over several time steps, each digital-to-analog element being adapted to convert a digital value into an analog value in each time step; generating a plurality of drive sequences to drive the array of digital-to-analog elements based on the digital signal, and upon identifying that the digital signal is below a threshold value shortening the drive sequences; and for each time step identifying a first set of elements and a second set of elements among the array of digital-to-analog elements; applying the shortened drive sequences to the first set; disabling the second set; and shifting the first set and the second set by one element.

Optionally, the shortened drive sequences may be concatenated. For instance, a first shortened drive sequence may be applied to a first subset of elements within the first set and a second shortened drive sequence may be applied to a second subset of elements within the first set, wherein the first subset and the second subset are juxtaposed to each other.

Optionally, the method comprises the steps of sampling the digital signal to obtain a series of digital samples; and modulating each digital sample to generate the plurality of drive sequences.

Optionally, disabling the second set comprises powering off the digital-to-analog elements of the second set.

Optionally, the digital-to-analog elements are selectively connected to an output of the converter; the method comprising identifying a third set of elements and disconnecting the third set from the output; and for each time step shifting the third set by one element.

Optionally, the third set is powered off.

Optionally, the method comprises powering up the third set at a predetermined time before reconnecting the third set to the output.

Optionally, the method comprises applying a sequence of predefined values to a predetermined set of elements for a predefined number of time steps. For instance, the predefined values may be hard coded zero values. Alternatively or in combination the sequence of predefined values may average to zero over time. The predefined number of time steps may be defined by an element at which the first set should start.

Optionally, the elements in the first set, second set and third set are provided in a successive order respectively.

Optionally, the digital-to-analog converter is a differential digital-to-analog converter and the array of digital-to-analog element comprises a first group of digital-to-analog elements and a second group of digital-to-analog elements coupled to a summation stage.

Optionally, the first group is configured to receive a first plurality of drive sequences and the second group is configured to receive a second plurality of drive sequences, the second plurality of drive sequences being identical to the first plurality of drive sequences with opposite sign.

Optionally, the first plurality of drive sequences and the second plurality of drive sequences form a plurality of differential drive sequences, each differential drive sequence comprising a set of values, each value being either a plus one state, a zero state or a minus one state; wherein shortening the drive sequences comprises identifying a shortening portion of the sequence that consists of at least one zero state.

Optionally, the first set of elements comprises an opening element having a predefined location within the array. For instance, in a normal mode of operation the opening element may be the first element in the array of elements. In a low power mode the opening element may be a function of the length of the shortening portion.

Optionally, upon identifying that the digital signal has increased above a normal mode threshold value, the method comprises enabling previously disabled elements; setting the predefined location of the opening element to be the first element in the array of digital-to-analog elements; and stop shortening the drive sequences.

Optionally, the method comprises applying a sequence of predefined values to predefined elements.

Optionally, the digital-to-analog elements are one-bit elements.

Optionally, the digital-to-analog elements comprise current digital-to-analog converter elements.

According to a second aspect of the disclosure there is provided a digital to analog circuit comprising a driver adapted to receive a digital input and to provide a plurality of drive sequences; a digital-to-analog converter comprising an array of digital-to-analog elements operable over several time steps, each digital-to-analog element being adapted to convert a digital value into an analog value in each time step; and a controller coupled to the driver and to the digital to analog converter; wherein upon identifying that the digital signal is below a threshold value, the controller is configured to shorten the drive sequences; and for each time step to identify a first set of elements and a second set of elements among the array of digital-to-analog elements; to apply the shortened drive sequences to the first set; to disable the second set; and to shift the first set and the second set by one element.

Optionally, the digital-to-analog converter is a differential digital-to-analog converter comprising a first group of 1-bit elements and a second group of 1-bit elements coupled to a summation stage.

Optionally, the driver comprises a first pulse-width modulator adapted to provide a first plurality of drive sequences and a second pulse-width modulator adapted to provide a second plurality of drive sequences.

Optionally, each digital-to-analog element is coupled to an output of the converter via a disconnection switch.

Optionally, the controller comprises a plurality of memory devices coupled to one or more multiplexers, each memory device being associated with a corresponding digital-to-analog element.

Optionally, the circuit comprises a sampler for sampling the digital signal. For example the sampler may be a sigma-delta modulator.

The digital to analog circuit according to the second aspect of the disclosure may comprise any of the features describes above in relation to the first aspect of the disclosure.

According to a third aspect of the disclosure, there is provided an audio device comprising a digital to analog circuit according to the second aspect of the disclosure.

The third aspect of the disclosure may share features of the first and second aspects, as noted above and herein.

BRIEF DESCRIPTION OF THE DRAWINGS

The disclosure is described in further detail below by way of example and with reference to the accompanying drawings, in which:

FIG. 6 is a table illustrating the working of the differential DAC of FIG. 5;

FIG. 15 is an audio device comprising the DAC circuit of FIG. 3.

DETAILED DESCRIPTION

Figure 1:
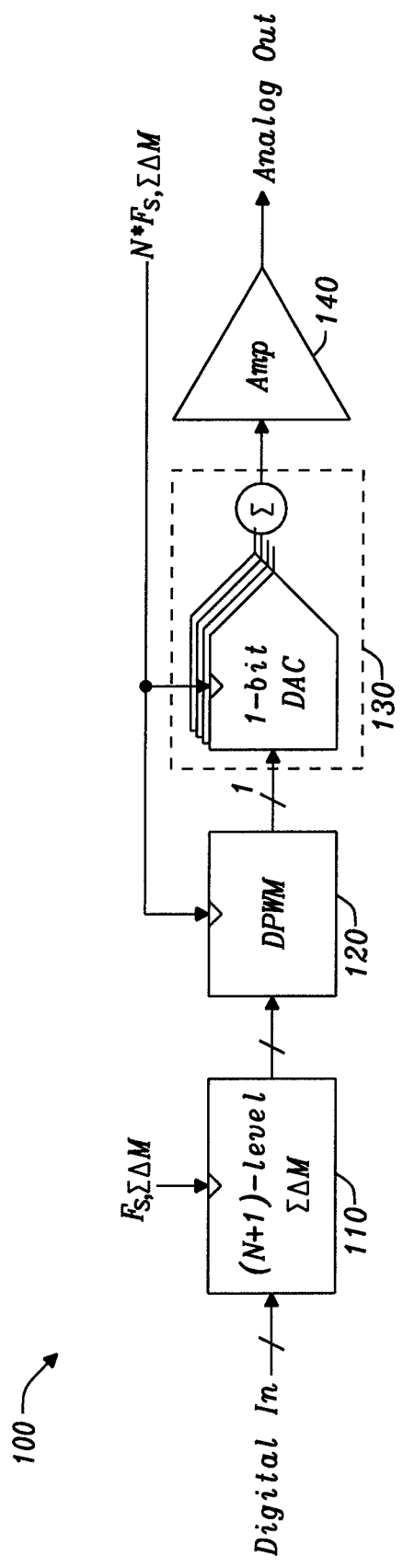
FIG. 1 is a block diagram of a conventional audio output amplifier circuit.

FIG. 1 illustrates a conventional PWM DAC architecture for audio output amplifiers. The system 100 includes a sigma-delta modulator 110, a digital pulse-width modulator (DPWM) 120, a DAC 130 and an amplifier 140. The DAC 130 is formed by a set of 1-bit DAC units also referred to as finite impulse response (FIR) filters. In this example, the DAC 130 has four tap FIR filters. The sigma-delta modulator 110, the digital pulse-width modulator DPWM 120, the DAC 130 and the amplifier 140 are connected in series.

In operation, the sigma-delta modulator 110 converts a digital M-bit input signal into a digital K-bit output signal with lower resolution (K<M) and higher frequency $F_{s,\Sigma\Delta M}$. The average of the K-bit output signal reflects the input signal. The DPWM modulator 120 converts the output of the sigma-delta modulator 110 to a 1-bit sequence at a higher clock frequency equal to $N*F_{s,\Sigma\Delta M}$. The DAC 130 then converts the DPWM output into an analog signal. Each DAC element in the DAC 130 is one analog FIR filter tap whose output is summed to all other DAC elements outputs and fed to the amplifier 140. The analog signal provided by the amplifier 140 is proportional to the digital input signal and may be used to drive a load.

The DPWM 120 provides a signal having a constant switching frequency. As a result the signal dependence of switching errors is eliminated. Moreover, each DAC element over time receives the same input signal and therefore contributes equally to the output, thus eliminating mismatch effects. Finally, each DAC element is periodically toggled, and thus its low-frequency noise is shaped. This approach requires a DPWM as well as a fast clock at a fixed multiple of the ΣΔM rate, hence increasing the size and power consumption of the device. In addition, the DPWM introduces non-linearity, in particular the even order non-linearity which mixes ΣΔ noise down in band.

Figure 2:
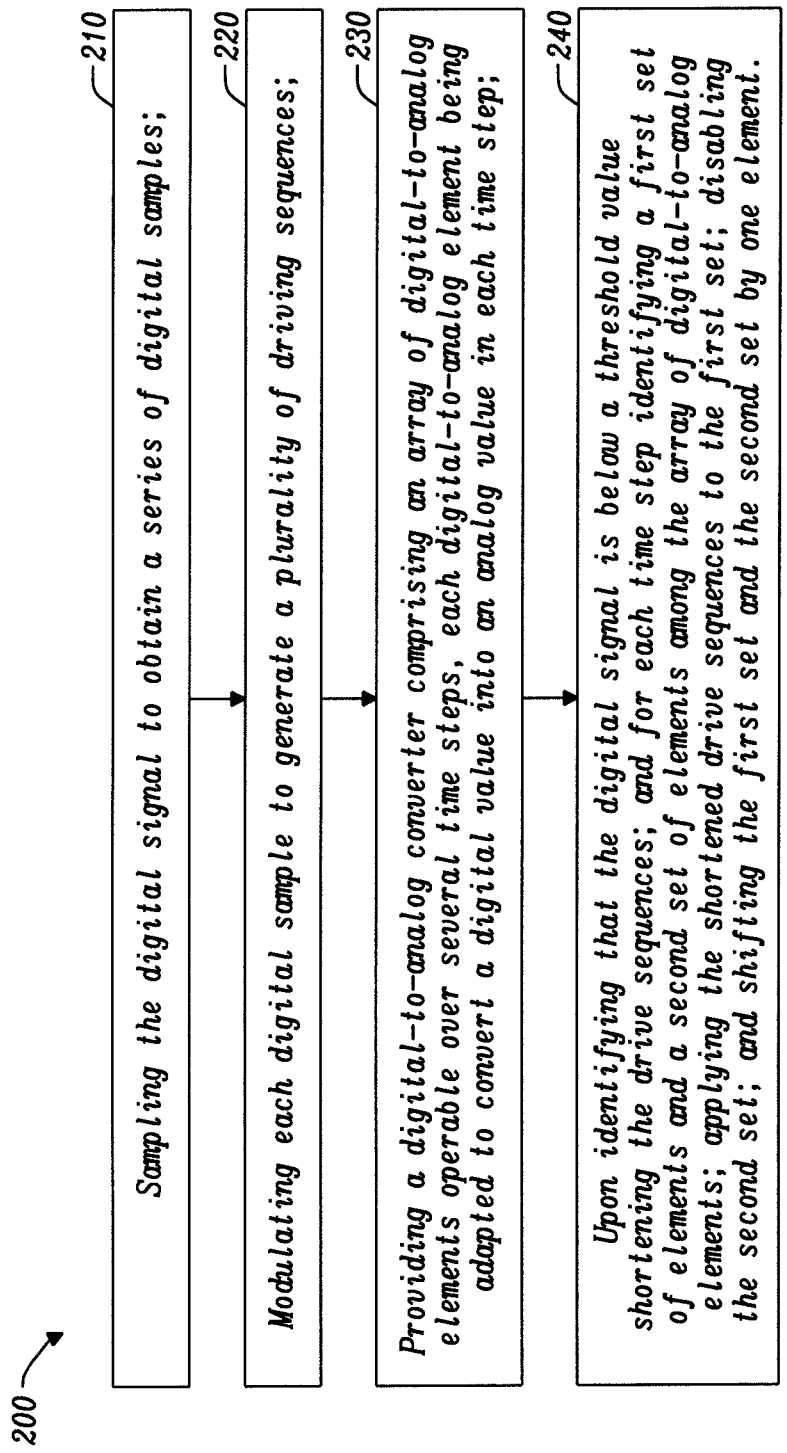
FIG. 2 is a flow chart of the method for converting a digital signal into an analog signal.

FIG. 2 is a flow chart of a method for converting a digital signal into an analog signal. At step 210, the digital signal is sampled to obtain a series of digital samples. At step 220 each digital sample is modulated to generate a plurality of driving sequences. At step 230, a digital-to-analog converter is provided. The digital-to-analog converter includes an array of digital-to-analog elements operable over several time steps, each digital-to-analog element being adapted to convert a digital value into an analog value in each time step. A time step may be defined by a clock cycle.

At step 240 a series of steps are performed upon identifying that the digital signal is below a threshold value, including: shortening the drive sequences; and for each time step identifying a first set of elements and a second set of elements among the array of digital-to-analog elements; applying the shortened drive sequences to the first set; disabling the second set; and shifting the first set and the second set by one element. Disabling the second set may include powering off the elements of the second set.

Figure 3:
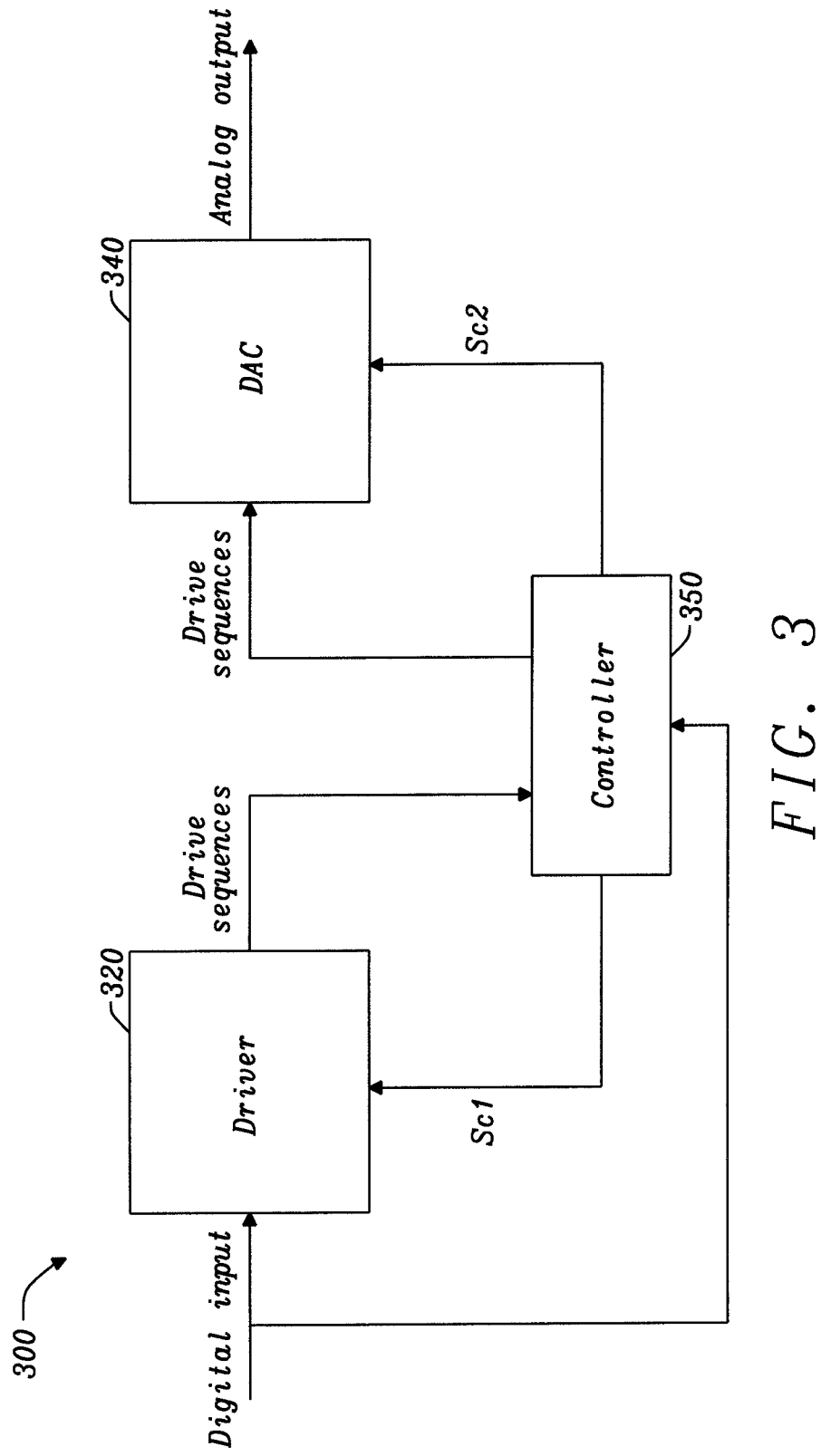
FIG. 3 is diagram of a circuit for implementing the method of FIG. 2.

FIG. 3 illustrates a digital to analog circuit for implementing the method of FIG. 2. The digital to analog circuit 300 comprises a driver 320 coupled to a DAC converter 340. A controller 350 is coupled to both the driver 320 and the DAC 340. The driver 320 has an input for receiving a digital input and an output for providing drive sequences to the controller 350. The controller 350 has an input for receiving the drive sequences and one or more outputs to apply the drive sequences to the DAC 340.

Moreover, the controller 350 has an input for receiving the digital input and one or more outputs to provide a plurality of control signals to operate the DAC in a specific mode of operation. The controller 350 may also include an output to send a control signal Sc1 to the driver 320. For instance, Sc1 could be used to place the driver 320 in a low-power mode based on the digital input signal level. The controller 350 may include a sensor to sense an amplitude of the digital input signal. The digital-to-analog converter 340 comprises a plurality of DAC elements not shown to convert the drive sequences into an analog value. The controller 350 may provide a plurality of control signals for controlling which DAC element should receive which digital input and at what time. A drive sequence is formed by a plurality of binary digits. The controller is configured to send the binary digits in the sequence to operate a predetermined DAC element at a predetermined time. The controller may be configured to operate the DAC either in a normal mode when the digital input signal is above a predetermined threshold, or in a low power mode when the digital input signal is below the threshold. The controller 350 is adapted to identify dynamically different sets of DAC elements within the DAC 340. For instance, the controller may be configured to identify a first set of elements for receiving the drive sequences, and a second set of elements which are not required and can be momentarily disabled. For instance the second set may be powered off and or disconnected from the DAC output.

A set of DAC elements is made of multiple consecutive DAC elements. Each set is dynamic, that is it can move through the whole series of DAC elements. For instance at a time t1 the set may include 10 DAC elements including DAC 20 to DAC 29 and at a later time the set of DAC elements may include 10 DAC elements including DAC 21 to DAC 30.

When the digital input signal falls below a threshold value, the controller 350 shortens the drive sequences. Then the controller 350 applies the plurality of drive sequences to the first set and powers off the second set. This may be achieved using the control signal Sc2. The control signal Sc2 may include a plurality of clock signals to control which DAC element should receive which digital input and at what time. The controller 350 is configured to shift the first set and the second set by one DAC element over time, for instance at every clock cycle. The circuit of FIG. 3 reduces DAC power consumption while maintaining or improving dynamic range.

Figure 4:
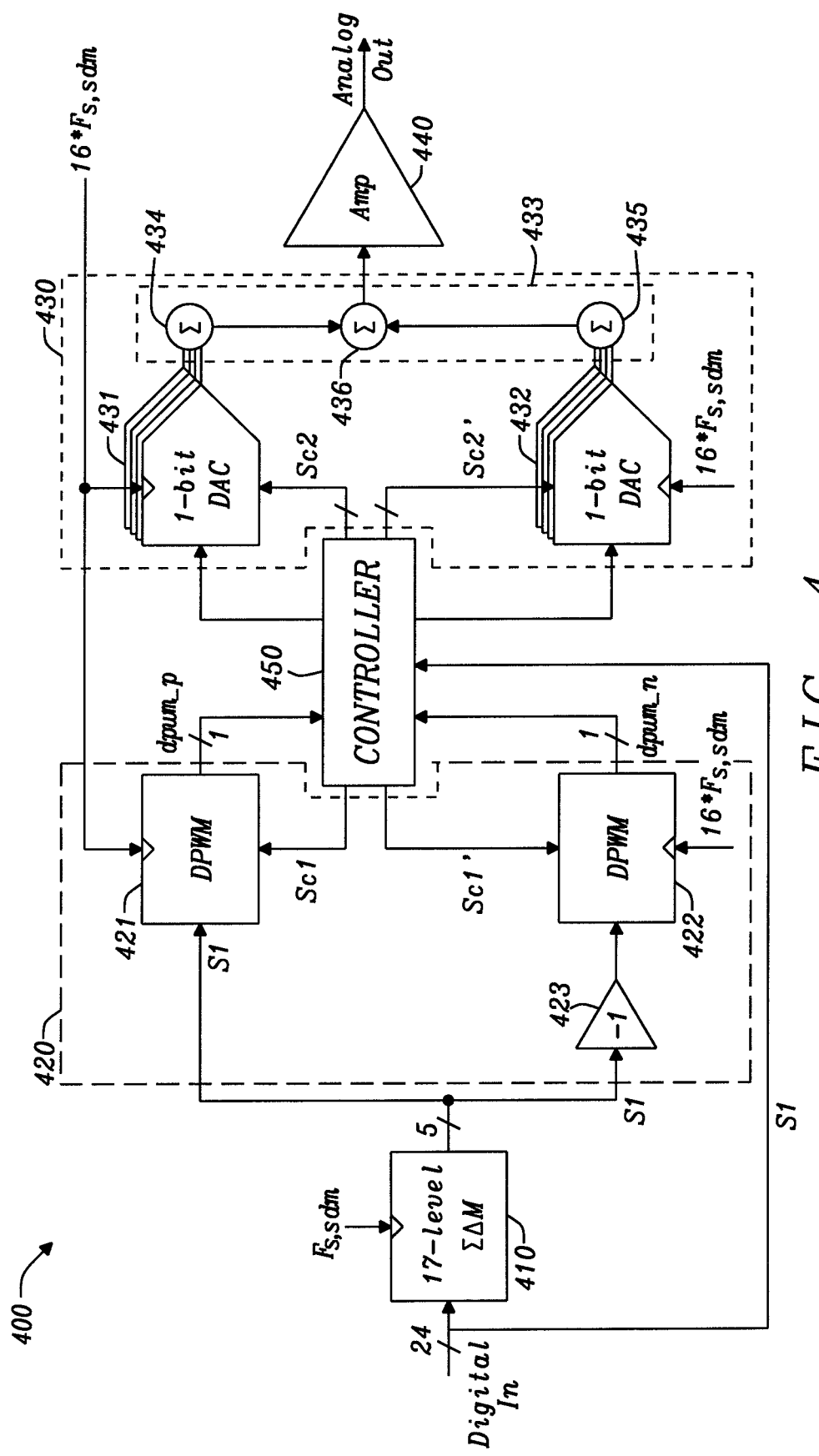
FIG. 4 is an exemplary embodiment of the circuit of FIG. 3.

FIG. 4 is an exemplary embodiment of the circuit of FIG. 3. The circuit 400 includes a sigma-delta modulator 410, a driver 420, a differential DAC 430, an amplifier 440 and a controller 450. The driver 420 includes a first DPWM 421, a second DPWM 422 and an inverter 423 coupled to the input of the second DPWM 422. The differential DAC 430 includes two groups or arrays of 1-bit DACs referred to as DAC elements. The DAC elements of the first group or array 431 are referred to as PDAC, and the DAC elements of the second group or array 432 are referred to as NDAC. The first DAC group 431 and the second DAC group 432 are coupled to a summation stage 433 for summing the output of the first and second groups of DACs. In this example each group 431, 432 includes four 1-bit DACs selectively coupled to an output. However, it will be appreciated that the number of 1-bit DAC elements may vary depending on the application. The controller 450 is coupled to both the driver 420 and the differential DAC 430.

The sigma-delta modulator 410 has an input for receiving a digital input signal and an output for providing a modulated digital signal to the driver 420.

The controller 450 has three inputs and a plurality of outputs. The three inputs include an input for receiving the digital input signal, an input for receiving a drive signal from the DPWM 421 and an input of receiving a drive signal from the DPWM 422. The outputs include one or more outputs to send control signals Sc1 and Sc2 to the driver 420 and to the DAC 430 and one or more outputs to send drive sequences to the DAC elements of the array 431 and 432. For instance, Sc1 could be used to place the driver in a low-power mode based on the digital input signal level. For example, Sc1 may be used to run the DPWM 421 at a slower clock rate for low signal levels. The controller 450 may be configured to operate the differential DAC 430 in a normal mode when the digital input signal is above a predetermined threshold, or in a low power mode when the digital signal is below the threshold. It will be appreciated that the digital signal received by the input of the controller 450 may be the same signal input to the sigma-delta modulator. Alternatively, the signal input to the controller may be the signal output by the sigma-delta modulator.

Each one of the first and second DPWM 421, 422 has three inputs and one output for providing a drive signal to the controller 450. The first DPWM provides a drive signal labelled dpwm_p and the second DPWM provides a signal labelled dpwm_n. The three DPWM inputs include a first input for receiving the output of the sigma-delta modulator 410, a second input for receiving a sampling frequency signal, a third input for receiving the control signal Sc1 from the controller 450.

Each one of the DAC elements forming DAC groups 431 and 432 has three inputs and one output for providing an analog signal. The three DAC elements inputs include a first input for receiving the drive sequences from the controller 450, a second input for receiving a sampling frequency signal, and a third input for receiving the control signal Sc2 from the controller 450.

The summation stage 433 has a first adder 434 coupled to the first group of DACs 431, a second adder 435 coupled to the second group of DACs 432, and a third adder 436 for providing an analog signal to the amplifier 440. It will be appreciated that the summation stage may be implemented in different fashions. For example, if the DAC-elements in the DAC groups 431 and 432 are current-mode DACs, the output nodes of each element can simply be shorted to implement addition. Subtraction may be implemented by shorting the positive output of one element with the negative output of another, and vice versa.

In operation the sigma-delta modulator 410 modulates the digital input signal to provide an output signal having a lower resolution and a higher frequency defined by the sampling frequency $F_{s,sdm}$. For instance the digital input signal may have a frequency of 48 KHz and the sampling frequency $F_{s,sdm}$ may be 3 MHz. In FIG. 4 a specific example is shown where the digital input of the sigma-delta modulator 410 is a 24-bit digital signal and its output is a 5-bit digital signal having one among 17 available values. The output of the sigma-delta modulator 410, 51, is sent to the driver 420. An inverter 423 is provided at the input of the DPWM 422 such that DPWM 421 and 422 receive input signals having a same amplitude but with opposite signs.

For each output signal provided by the sigma-delta modulator 410, the DPWMs 421 and 422 produce a sequence of 1-bit digital signals at frequency $N*F_{s,sdm}$, in which N is an integer. If the sigma-delta modulator 410 has a N+1-level output, then each sample is represented by a sequence of N bits. Considering an exemplary numerical example, if the sampling frequency applied to the sigma-delta modulator $F_{s,sdm}$ is 3 MHz and if N=16, the sampling frequency applied to DPWM 421 and 422 and the first and second DAC groups 431, 432, is 48 MHz. The 1-bit streams provided by the DPWMs 421 and 422 are transmitted to the controller 450 and are used by the controller to output drive sequences to the differential DAC 430 to drive the 1-bit DAC elements PDAC and NDAC of the first and second groups 431 and 432 respectively. The first adder 434 sums the outputs of the PDAC elements, and the second adder 435 sums the outputs of the NDAC elements. The third adder 436 subtracts the output provided by the second adder 435 from the output provided by the first adder 434. The signal provided by the differential DAC 430 is sent to the amplifier 440 to obtain an amplified analog output of the digital input signal. The digital input may be an audio signal, and the amplified analog output may be used to drive a speaker. The positive and negative DACs 431 and 432 may be implemented with different types of DAC elements including but not limited to current elements (IDAC) or resistor elements (RDAC).

Figure 5:
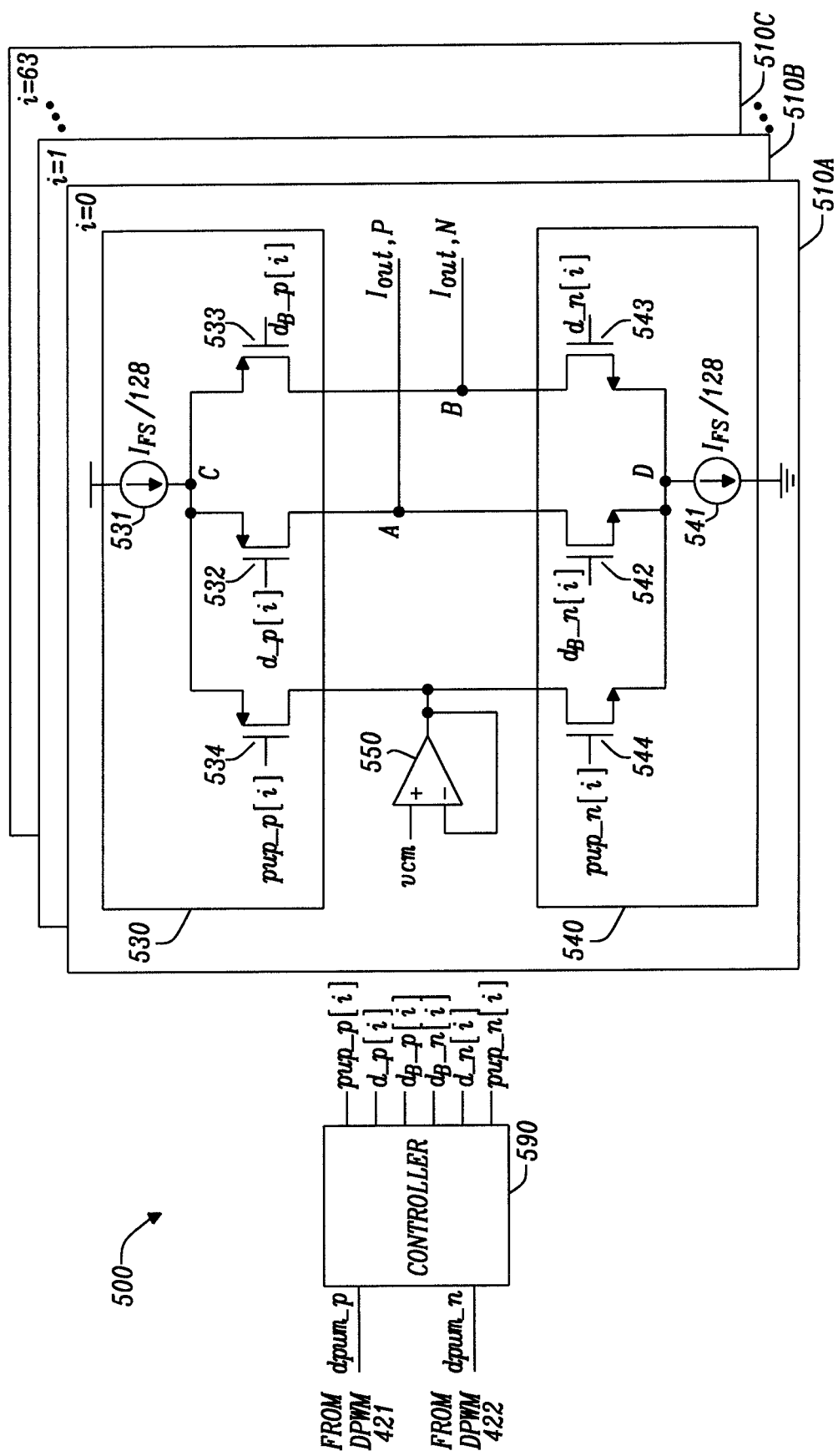
FIG. 5 is a diagram of a current-mode differential DAC for use with the circuit of FIG. 4.

FIG. 5 shows an exemplary embodiment of a differential DAC structure using current-mode DACs that may be used in the circuit of FIG. 4. In this specific example, a current-mode differential DAC including 64 Finite Impulse Response FIR taps, providing a full-scale output current IFS is illustrated. For clarity only three FIR taps 510A, 510B and 510C are illustrated.

Each FIR tap 510 is a 1-bit DAC element that includes a top circuit portion 530 coupled to a bottom circuit portion 540. The top circuit portion 530 implements a PDAC element and the bottom circuit portion 540 implements a NDAC element. The top and bottom circuit portions 530 and 540 implement a differential DAC element.

With reference to the first FIR tap 510A, the top circuit portion 530 includes a current source 531 coupled to three switches 532, 533 and 534. Similarly, the bottom circuit portion 540 includes current source 541 coupled to three switches 542, 543 and 544. The switches 532 and 542 are coupled at output node A, while switches 533 and 543 are coupled at output node B for providing output current $I_{out,P}$ and $I_{out,N}$ respectively. When all switches 532, 533, 542 and 543 are open, the current sources 531 and 541 are disconnected from the output nodes A and B.

Optionally, an operational amplifier 550 may be provided. In this case, the switches 534 and 544 are coupled to the output of the operational amplifier 550. The operational amplifier 550 has a negative feedback loop and is configured to provide a low impedance path for current sources 531 and 541 when the switches 534 and 544 are closed and switches 532, 533, 542, 543 are open (current sources powered on but disconnected from $I_{out,P}$ and $I_{out,N}$).

In this example the current sources are identical for all PDAC FIR taps and NDAC FIR taps and provide a fixed current $I_{FS}/(2*K)$ in which K is the number of elements. In this example each current source provides a current equal to $I_{FS}/128$.

Each differential DAC element 510A, 510B, etc. is coupled to the controller 590 via a plurality of control lines. The controller 590 provides six signals to control the switches of each differential DAC. With respect to the differential DAC 510, the controller provides the signals pup_p and pup_n to control the switches 534 and 544; the signals d_p and d_n to control the switches 532 and 543 and the signals dB_p and dB_n to control the switches 533 and 542.

In operation, the signals coming from the digital pulse-width modulators (dpwm_p and dpwm_n) are fed to the controller 590 and used to open/close the switches in the PDAC and NDAC to control the current at output nodes A and B. Depending on the chosen mode of operation, the controller may power on or power off specific DAC elements in the array and/or disconnect specific DAC elements from the output.

With the differential DAC architecture of FIGS. 4 and 5 the error introduced by the DPWMs 421 and 422 which is common to both is mutually cancelled in the summing stage 433. Therefore, this architecture can mitigate to a large degree the issues arising from the even-order non-linearity in non-differential PWM DAC architectures such as the one of FIG. 1.

FIG. 6 is a table illustrating the number of DAC elements necessary in order to generate various analog signals. In this specific example the signal driving the system 500 comes from a sigma-delta modulator with a 65-level output. The first column of table 600 shows possible outputs of the sigma-delta modulator. The second, third, fourth and fifth columns indicates the number of PDAC and NDAC elements providing either a current of +1/128 or −1/128 for each sigma-delta modulator output, ΣΔM output. The last column of table 600 shows the number of redundant PDAC/NDAC elements for each ΣΔM output.

For instance, when the average output signal of the sigma-delta modulator is +1, 64 PDAC elements produce a current of +1/128 and 64 NDAC elements produce a current of −1/128 such that all 128 elements of the differential DAC are used. However, when the average output signal of the sigma-delta modulator is null, 32 PDAC elements produce a current of +1/128, 32 PDAC elements produce a current of −1/128, 32 NDAC elements produce a current of +1/128, and 32 NDAC elements produce a current of −1/128. In this case the average zero can be achieved simply by using 32 PDAC elements producing a current of +1/128 and 32 NDAC elements producing a current of +1/128. Therefore 32 PDAC elements and 32 NDAC elements are unnecessary. In general, the number of unnecessary elements increases as the sigma-delta modulator signal decreases.

With reference to FIG. 5, each input audio sample is modulated into sequences dpwm_p and dpwm_n by the DPWMs and then passed to the controller 590 to generate the signals d_p[i], dB_p[i], d_n[i] and $d_B$_n[i]. These drive sequences signals are sent to the 64 PDAC elements and the 64 NDAC elements to drive their respective switches. Since the dpwm_p and dpwm_n sequences are obtained by modulating signals of equal magnitude but opposite in signs, for each ΣΔM output in the table the number of PDAC cells outputting +Ifs/128 (−Ifs/128) is the same as the number of NDAC cells outputting −Ifs/128 (+Ifs/128). At low signal levels, most of the PDAC elements will be sourcing the same current as the corresponding NDAC element is sinking. Whenever this happens, no signal component appears at the output for that DAC element, only the noise of both, making these DACs redundant. Therefore when the differential DAC of FIG. 5 is operating at low signal levels, only a fraction of the total DAC elements is needed in order to output the correct signal.

Unnecessary elements may be disconnected from the output to reduce the total noise when the signal level is low and reenabled when the signal level is high. If the total noise is reduced at low signal levels, then the dynamic range improves. Likewise, the overall DAC power can be reduced for the same dynamic range performance. Moreover, these unused DAC elements can be powered down dynamically for additional power savings. This is very advantageous in low-signal level modes, since output noise is often specified with no audio input.

However, enabling and disabling elements can lead to undesirable results. If a portion of the DAC element array is simply disconnected, the 1-bit data stream is no longer passed through all the elements and highly desirable features such as mismatch and 1/f noise mixing are no longer achieved. Care must be taken as well to ensure that the transitions between low-level and high-level modes happen cleanly and without audible artefacts.

As mentioned above, the controller is configured to power off/on and to disconnect/connect the individual DAC elements, thus allowing it to operate the DAC either in a normal mode when the digital signal is above a predetermined threshold, or in a low power mode when the digital is below the threshold. The dynamic control of the DAC elements in various modes will now be described with reference to FIGS. 7 to 11.

Figure 7:
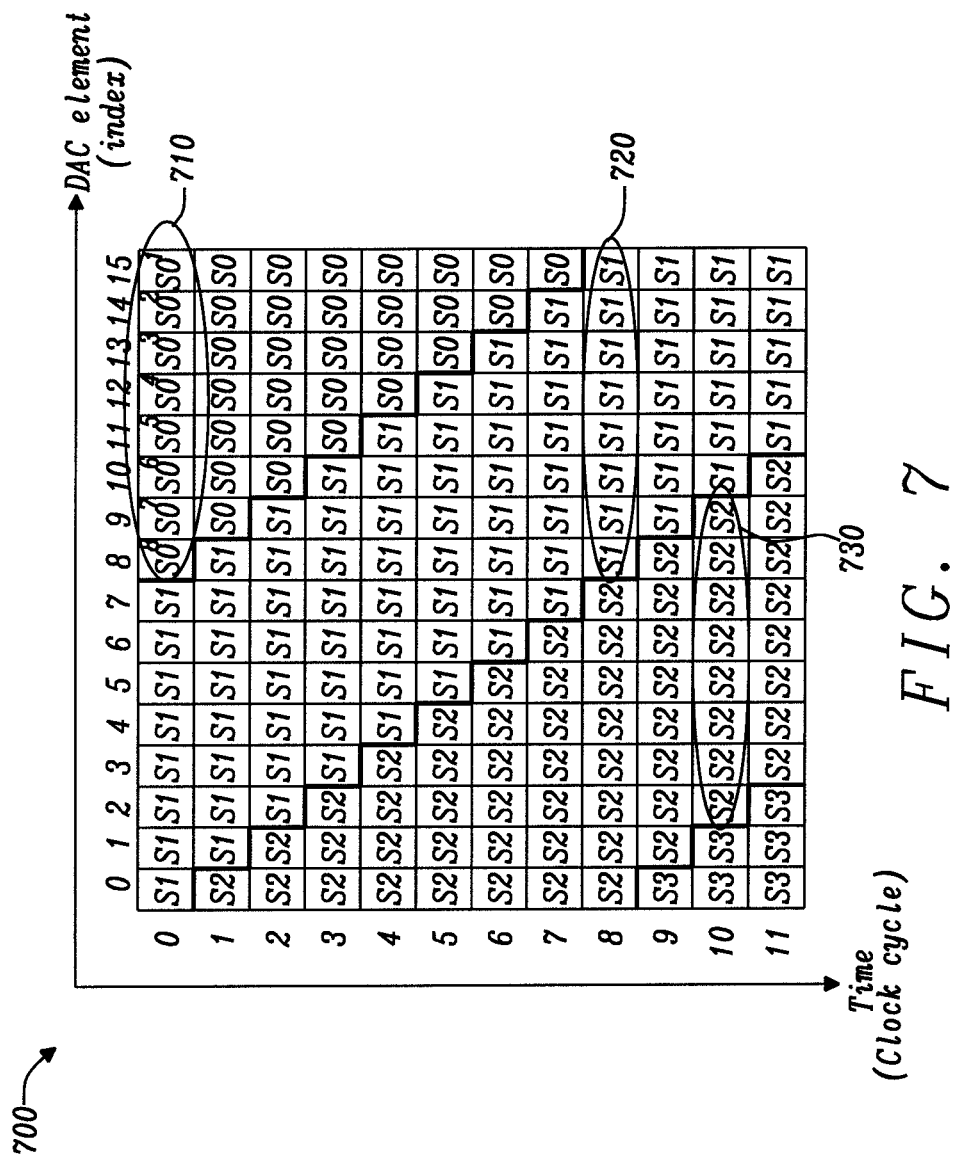
FIG. 7 is a table illustrating signals received by 16 DAC elements as a function of time in a normal mode of operation.

FIG. 7 is a table illustrating the workings of a DAC operating in a normal mode. In this example a N=8 PWM sequence is passed to a K=16 FIR tap DAC. This could be for example a DAC resembling the system 500 of FIG. 5 with 16 taps instead of 64. The columns of table 700 represent DAC elements and the rows represent time indices with time increasing from top to bottom. The values in each cell of table 700 represent the pseudo-differential sequence fed to the DAC by the DPWMs via the controller. The pseudo-differential sequence may be defined as the difference between the signal dpwm_p generated by DPWM 421 minus the signal dpwm_n generated by DPWM 422. In particular, the S0 sequence 710, the S1 sequence 720, the S2 sequence 730 are PWM sequences of N=8 bits each, encoding consecutive ΣΔM samples. For instance, the S0 differential sequence 710 may be $S0^1$=0, $S0^2$=0, $S0^3$=−1, $S0^4$=1, $S0^5$=1, $S0^6$=−1, $S0^7$=0, $S0^8$=0. The sequence S0 is the PWM sequence encoding the ΣΔM sample #0. Similarly the sequence S1 encodes the ΣΔM sample #1, etc. At each clock cycle the output of individual DAC elements are summed together and the 8-bit sequences shift down the DAC array that is to the right in this representation, by one step. Since there are 16 cells, an initial 16 clock cycle delay takes places as the PWM signal makes its way down the array the very first time (not shown in the table).

For input signals having sufficiently small magnitude, some bits at both ends of the 8-bit sequence will be zero and the signal content (+1s or −1s) will only appear in a central portion of the sequence. The magnitude threshold depends on both the signal level and the high-frequency gain of the ΣΔM.

Figure 8:
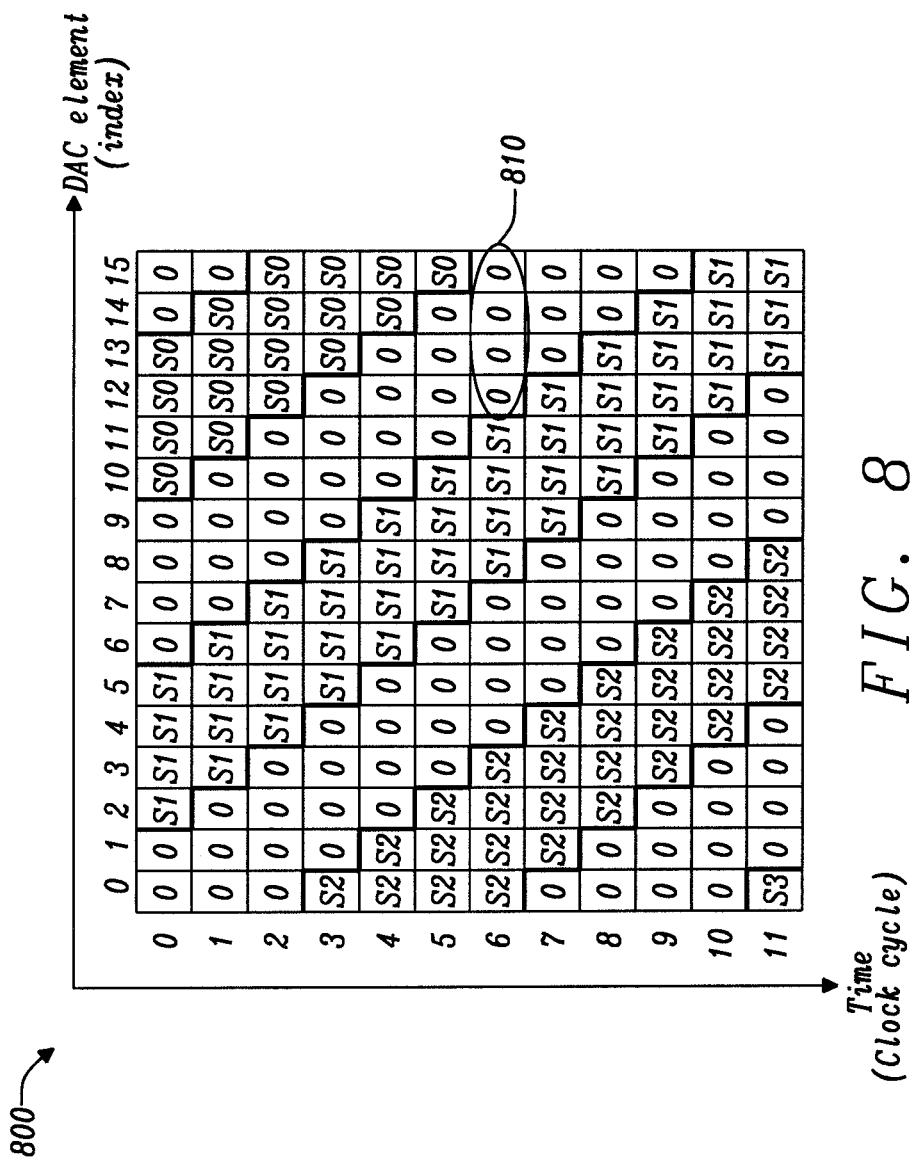
FIG. 8 is a table illustrating signals received by 16 DAC elements as a function of time in a low power mode of operation.

FIG. 8 is a table illustrating the workings of the same DAC when a low-level input signal is received. In this case only M central bits of each N=8 PWM sequence contain signal information and the other ones are zero. In this specific example M=4.

The PWM DAC power can be reduced by disconnecting from the output each unit of the PDAC and NDAC arrays that is known to hold a zero. These would be the DAC elements corresponding to the cells 810 of table 800 showing a zero. For resistor mode architectures, the disconnection of DAC elements results in an immediate decrease in power consumption. In the case of an RDAC, the output current of a DAC cell is created by connecting a resistor between one of two reference voltages and the output node. With no current source to power up or power down, an RDAC cell only consumes power when it delivers power. For current-mode DAC architectures such as the one of FIG. 5, enabling and disabling DAC elements may require many clock cycles in order to be performed with enough accuracy. Additionally, significant power consumption is associated with charging and discharging capacitance inside each DAC element. Therefore, this method would result in a considerably lower power reduction for IDACs than for RDACs. For example, for the case illustrated above, where 75% of the sequence can be truncated and one quarter of the IDAC element arrays is powered up but disconnected at any time, the theoretical power reduction for RDACs would be 93.75% but only 75% for IDACs. A better way of reducing the PWM DAC power consumption is illustrated in FIGS. 9A and 9B.

Figure 9A:
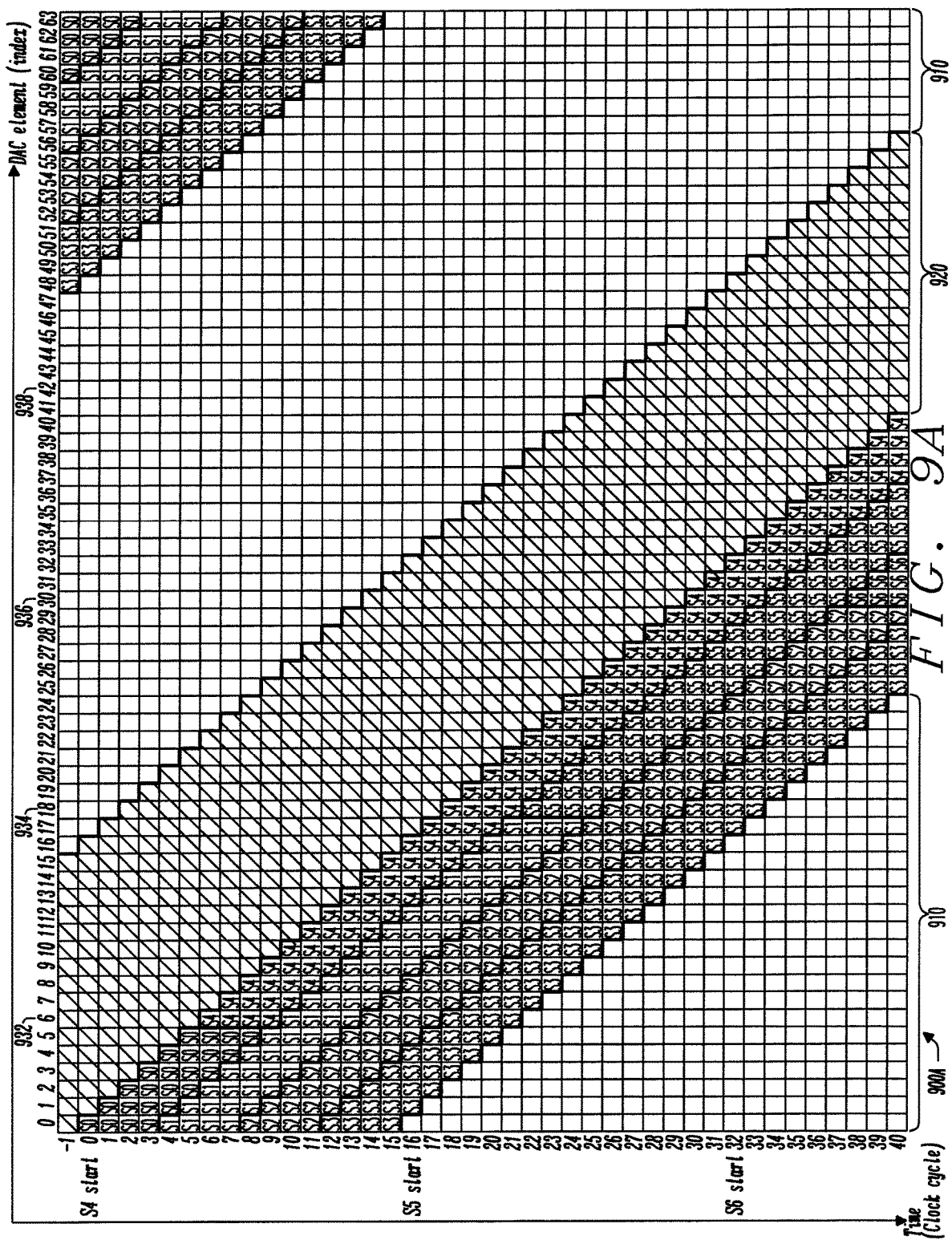
FIGS. 9A and 9B are tables illustrating the dynamic control of DAC elements when operating in a low power mode according to the method of FIG. 2.
Figure 9B:
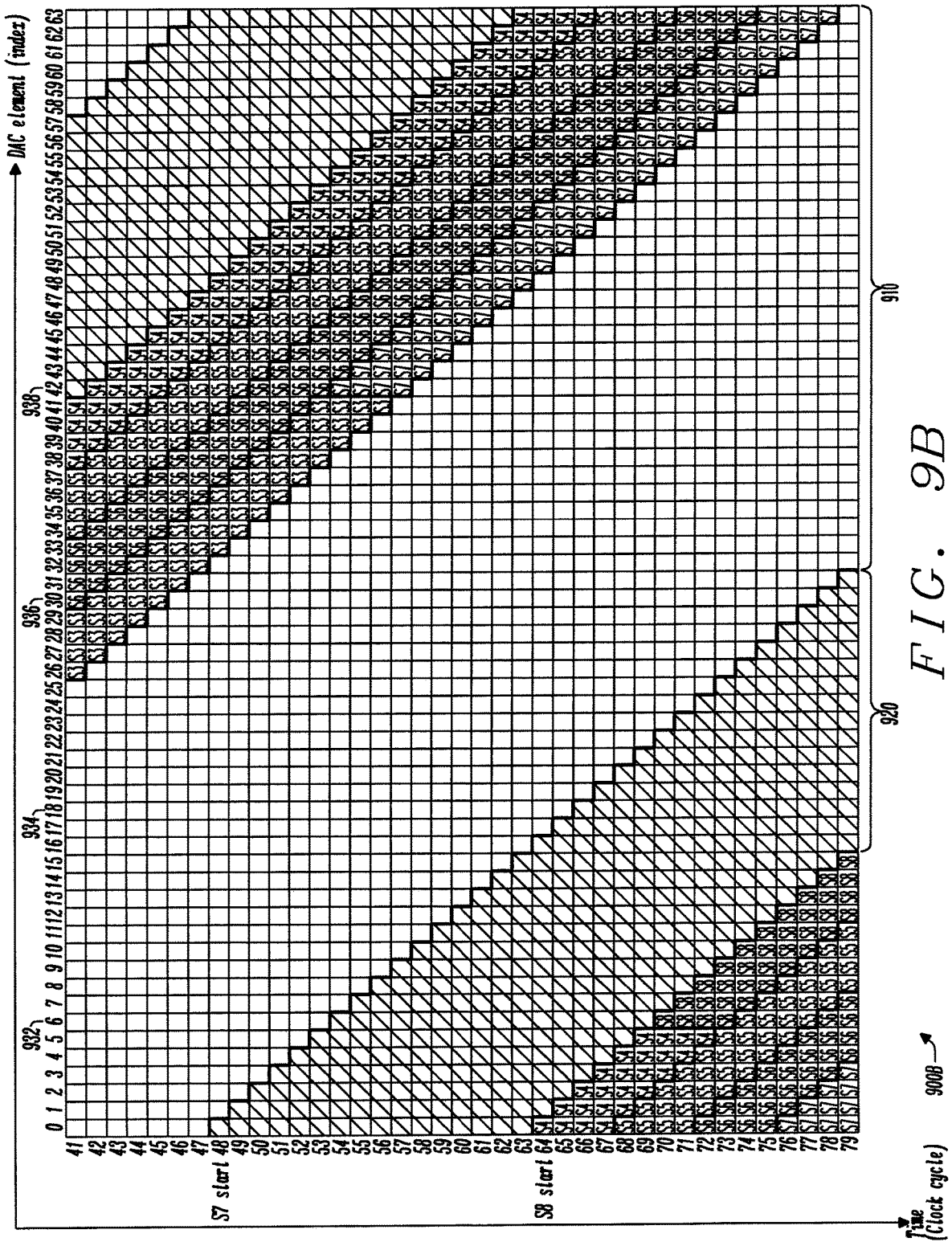

FIGS. 9A and 9B illustrate the workings of the circuit of FIG. 5 when the method of FIG. 2 is being used. Table 900 of FIG. 9A (table 900A) and 9B (table 900B) is analogous to table 700 but illustrates the case of a 64-tap DAC (instead of 16) and a 16-bit PWM sequence (instead of 8-bit). Each cell in the table 900 represents the state of a DAC element at a specific time step.

Three sets of elements are identified within the array of elements at different time steps or clock cycle. For instance at clock cycle 0, a first set includes elements 0 and 49 to 63; a second set 910 includes elements 17 to 48 and a third set includes elements 1 to 16. Each set then shifts by one element at each clock cycle. So at clock cycle 1, the first set includes elements 0.1 and 50 to 63; the second set 910 includes elements 18 to 49 and the third set includes elements 2 to 17. In this example the cells 910 represent powered off DAC elements, the cells 920 represent disconnected but powered up DAC elements and the remaining cells represent powered and connected DAC elements. The number of 910 cells and 920 cells being used will vary depending on the application. For example, there can be fewer cells in 920 and more cells in 910 if the cells powerup faster. It will also be appreciated that if the method where to be implemented with RDAC, which do not need to be powered up, one would only use a set 920 of disconnected cells regarded as being disabled. As previously explained, at low-input signals only the central bits of each PWM sequence contain information, therefore it is possible to remove the ends of the sequence without losing information.

The PWM sequence may by shortened by truncating the ends of each PWM sequence by a pre-fixed number K of bits for instance by 6 bits at each end in the example of FIG. 9. The shortened sequences are then inserted into and passed through the array concatenated to each other. In this way, at each time step only a predetermined portion of the DAC element array is needed to transmit the signal information, and this predetermined portion shifts across the array over time. The unused DACs are disconnected, and some may be powered off and turned on again when needed. In order to disconnect and power on/off the DAC cells as required, a controller such as the controller 450 of FIG. 4 is used to send power on/off signals to the DACs. For example, in a current-mode implementation as illustrated in FIG. 5, the controller can connect/disconnect the DAC element 510*a* using switches 532, 533, 542, 543.

To maintain continuity with normal PWM DAC operation, new data bits may be inserted into the array at the same clock cycle that they would normally appear at bit 0. The first DAC cell in the array may be kept without data. Data may then be inserted at predetermined points in the array. The PWM sequences of FIG. 9 have been truncated by 6 bits at the beginning and 6 at the end, leaving 4 signal bits. These four bits should be inserted at a same point in time as they would have appeared normally. The number of insertion points may be determined by the ratio of the total number of DAC elements and the length of the non-truncated PWM sequences. For example, the DAC illustrated in FIG. 9 has 64/16=4 insertion points labelled 932, 934, 936 and 938 corresponding to table coordinates (6,6), (18,22), (30,38) and (42,54) respectively. Therefore the first insertion point is at the $6^{th}$ element in the array, the second at the $18^{th}$ element, the third at the $30^{th}$ element, and the last one at the $42^{nd}$ element. If the DAC elements require multiple clock cycles to power up, their powerup signals can rotate in advance of the PWM samples. For example in table 900 it is assumed that a DAC element requires 16 PWM clock cycles to fully power up, therefore each powered-off element (cells 910) turns on 16 clock-cycles before receiving the first signal bit. This working mode can be implemented by the controller 450 of FIG. 4 via e.g. a rotating digital buffer with multiple shift-in points.

Figure 10A:
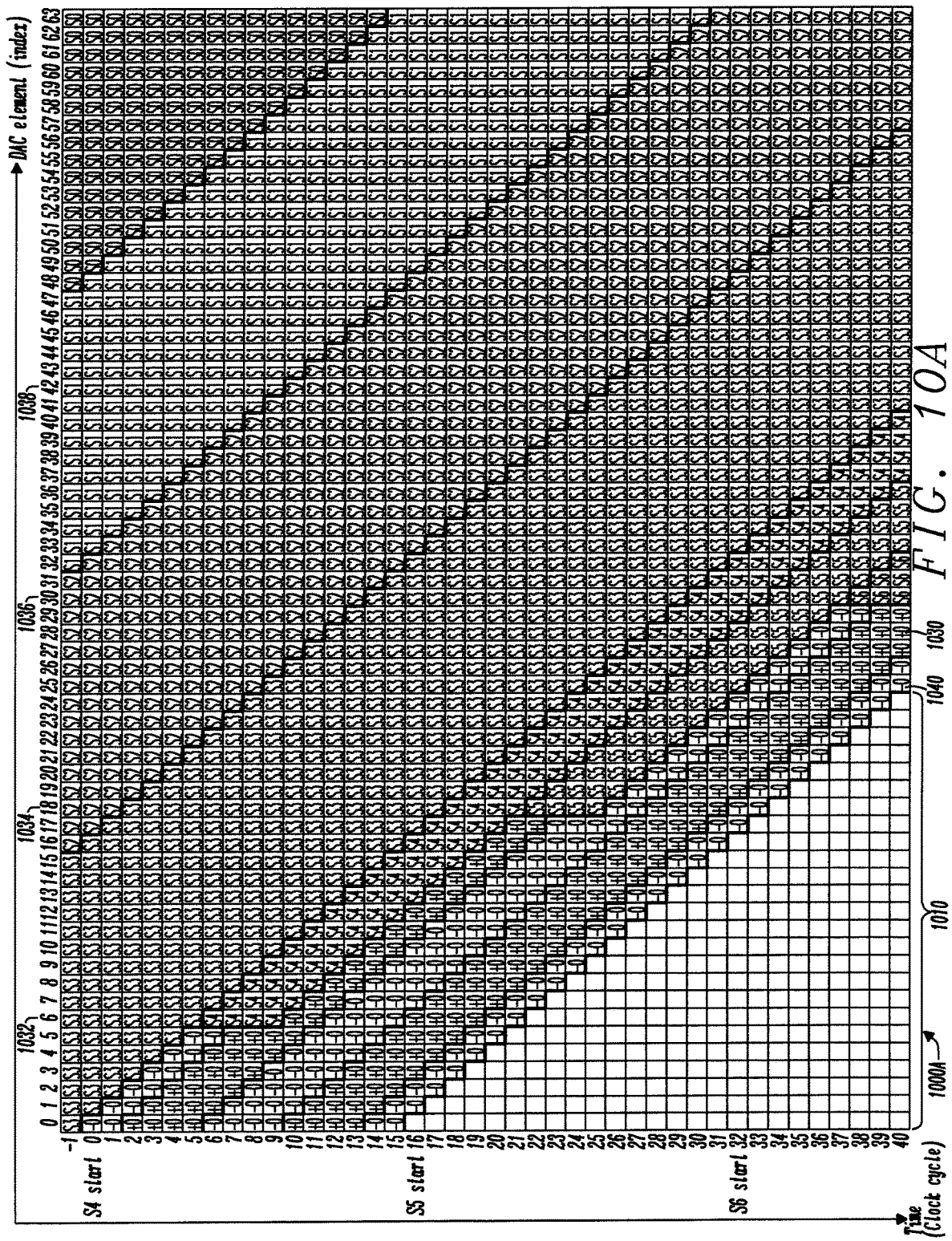
FIGS. 10A and 10B are tables illustrating the dynamic control of DAC elements for entering a low power mode from a normal mode of operation.
Figure 10B:
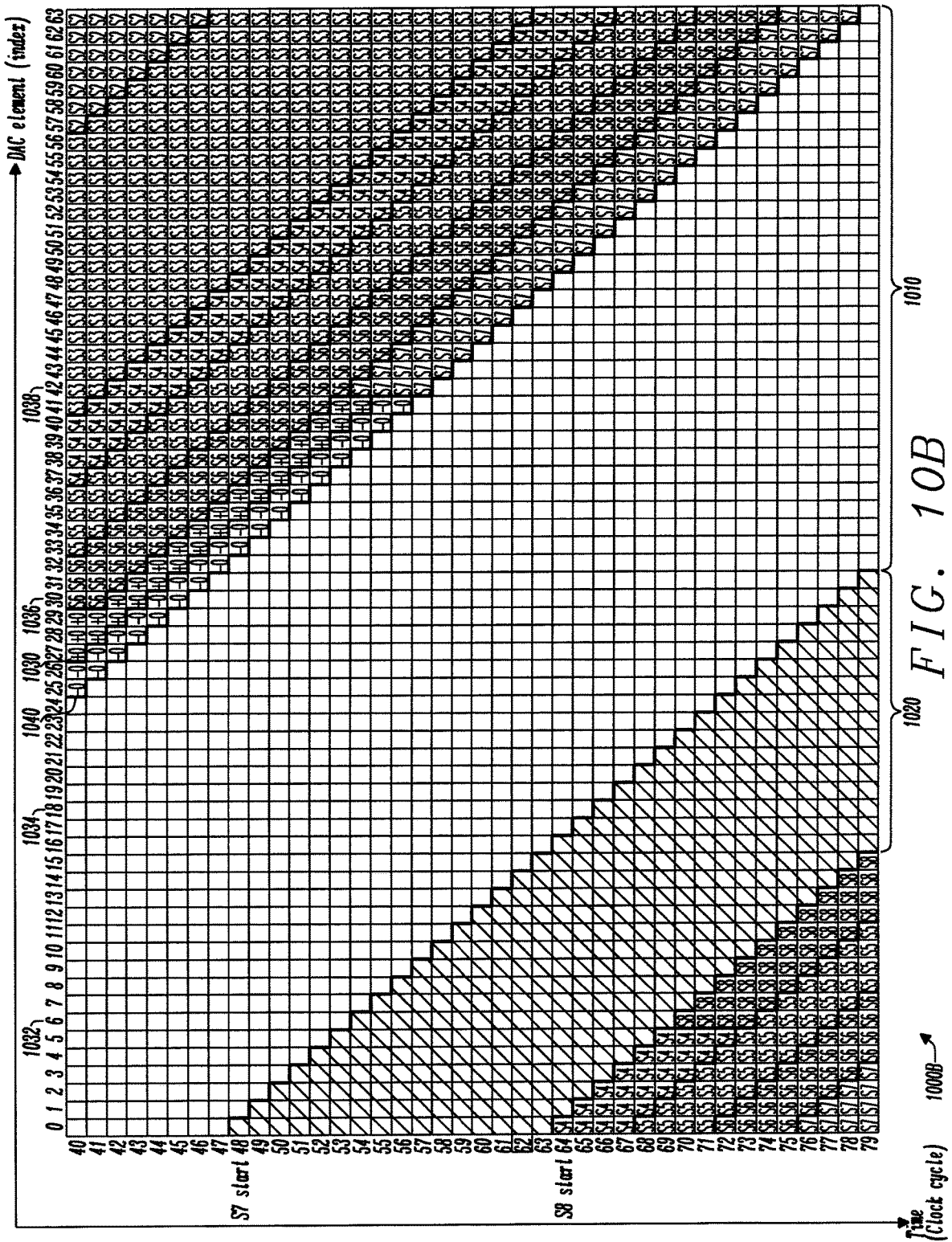

FIGS. 10A and 10B illustrate a transition from a normal mode of operation as shown in FIG. 7 to a low power mode of operation as shown in FIG. 9. The table 1000 of FIG. 10A (table 1000A) and 10B (table 1000B) is analogous to the table 900 and applies to a 64-tap DAC and a 16-bit PWM sequence. The cells 1010 represent powered off DAC elements, cells 1020 represent disconnected but powered up DAC elements and the remaining cells represent powered up and connected DAC elements. Additionally, the cells 1030 labelled +0 and the cells 1040 labelled −0 indicate DAC elements hard-coded with predefined values. The predefined values are added in order to maintain a constant switching activity in the DAC even when some of the DAC elements are not receiving signal content. The predefined values may be chosen so that their overall contribution to the output is zero. For example, in a current-mode DAC such as the one of FIG. 5, the controller might be configured to send drive sequences that hard code the cells 1030 with a +0 state and the cells 1040 with a −0 state. The +0 state corresponds to a configuration in which switches 532 and 542 are closed, the switches 533, 543, 534, 544 are opened, and nearly zero current flows out $I_{out,P}$ and $I_{out,N}$ from this cell. The −0 state corresponds to a configuration in which switches 533 and 543 are closed, the switches 532, 542, 534, 544 are opened, and nearly zero current flows out $I_{out,P}$ and $I_{out,N}$ from this cell. For both +0 and −0 states, the output current is ideally zero but some small amount of current may flow due to mismatch between the current sources 531 and 541 or other higher-order effects.

When the first sample to be truncated is sent to the DAC, the controller starts filling the unnecessary cells in the array with hard coded +0 and −0, while the bits of the truncated sequences are inserted at the insertion points 1032, 1034, 1036 and 1038, as described for FIG. 9. New hard-coded bits are inserted at the beginning of the array for M*P clock-cycles, where M is the number of bits in the truncated sequence and P the number of insertion points (in this case 4*4=16 cycles). The hard-coded values shift through the array but do not complete a full rotation. The first M hard-coded values inserted shift until they reach the first insertion point at DAC element 6, the second M hard-coded values inserted shift until the second insertion point at DAC element 18, etc. After this the system starts operating in low power mode, as illustrated in FIG. 9.

Figure 11A:
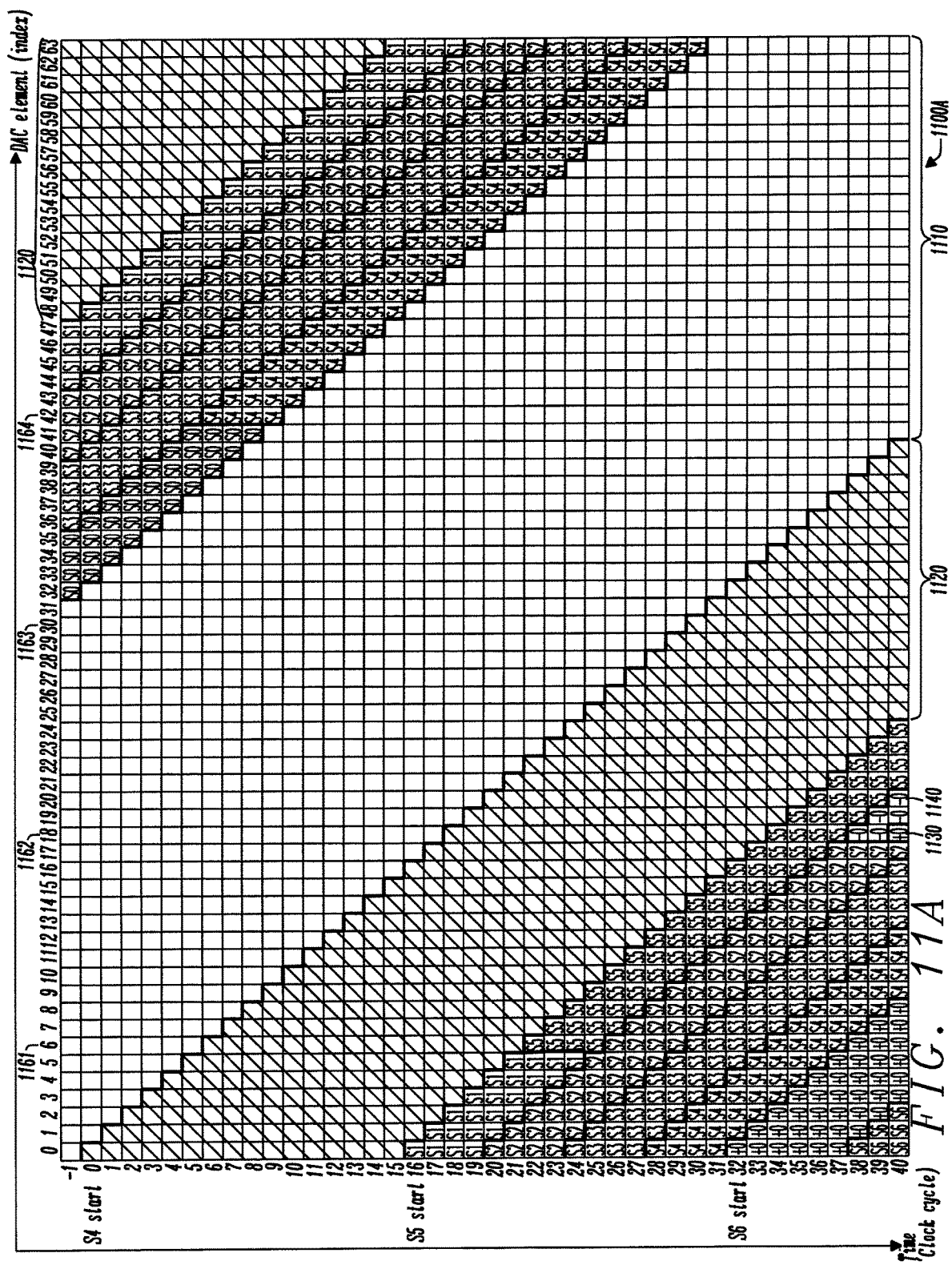
FIGS. 11A, 11B and 11C are tables illustrating the dynamic control of DAC elements for exiting the low power mode.
Figure 11B:
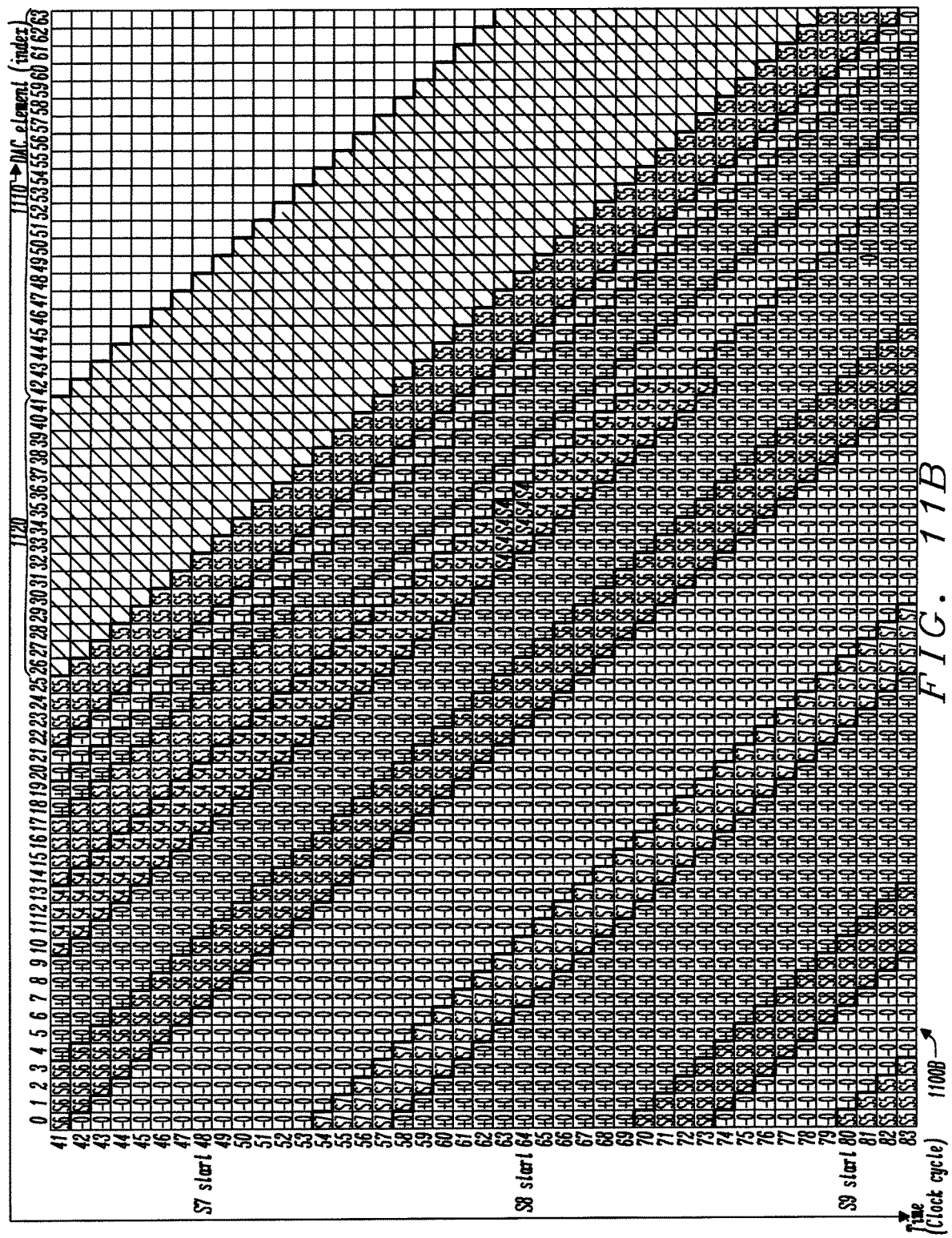
Figure 11C:
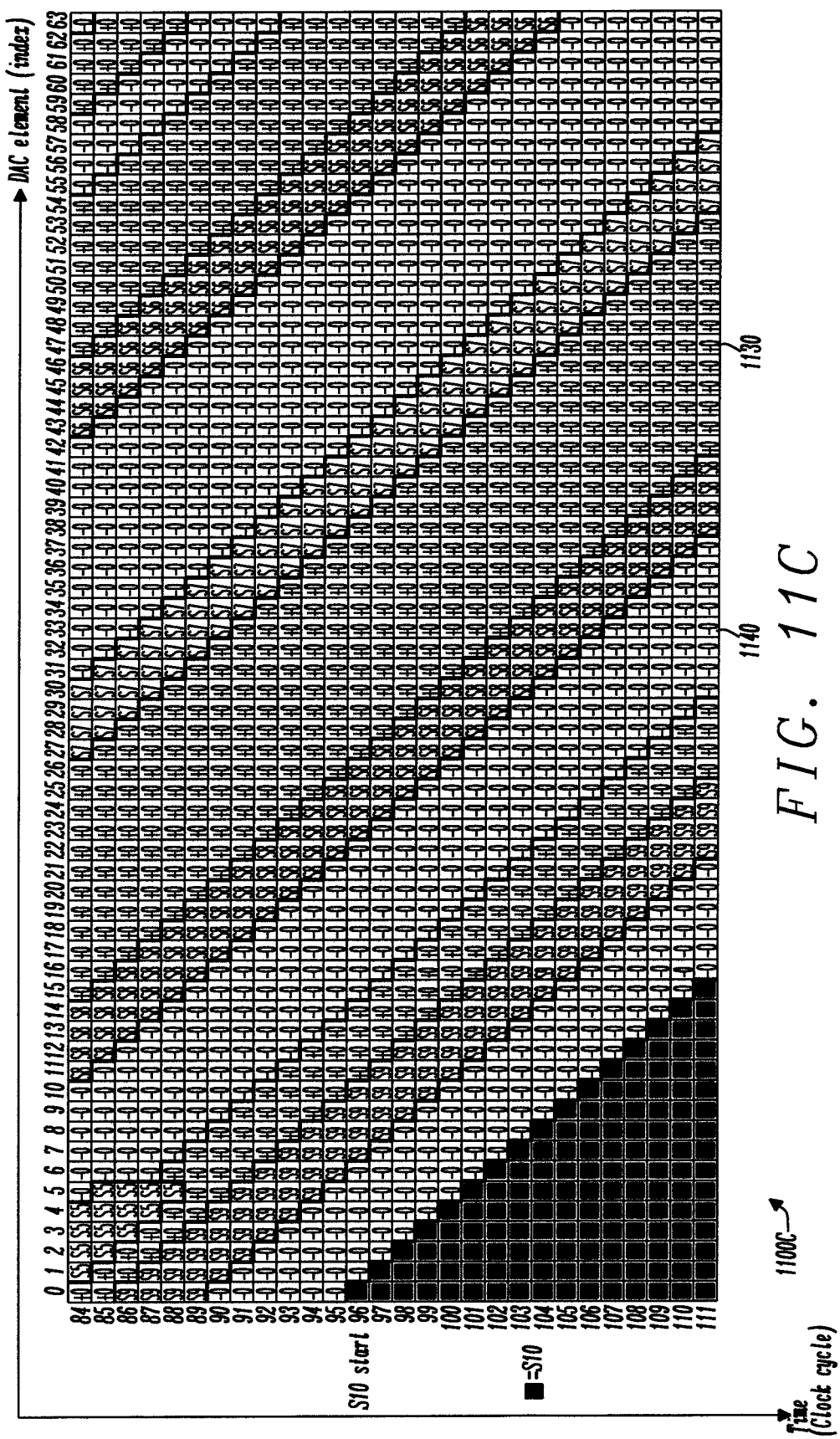

FIGS. 11A, 11B and 11C are tables illustrating a transition from a low power mode of operation to a normal mode of operation. The table 1100 of FIG. 11A (table 1100A), 11B (table 1100B) and 11C (table 1100C) is analogous to the table 1000 and applies to a 64-tap DAC and a 16-bit PWM sequence. The cells 1110 represent powered off DAC elements, the cells 1120 represent disconnected but powered DAC elements and the remaining cells represent powered up and connected DAC elements. Additionally, the cells 1130 labelled +0 and the cells 1140 labelled −0 represent hard coded states +0 and −0, respectively. The references 1161, 1162, 1163, 1164 represent the insertion points where signal bits are applied to the array during the truncation mode.

In operation, when the controller determines that a transition to the normal mode is required, the controller waits until the left-most insertion point 1161 receives a new truncated sequence. In this example this occurs at clock 22, when the DAC receives the first bit of the truncated sequence S5. From this moment onward the controller stops sending power off signals to the array of DAC elements. Instead of being powered off, the DAC elements receive a hard coded value. The following truncated PWM sequence, S6, is inserted at the DAC element of index 0 like in the normal mode of operation (clock 38, DAC element 0), instead of being inserted at the second insertion point 1162 (clock 38, DAC element 18), where hard-coded +0s and −0s are inserted in its place. This insertion mode continues until all sequences that were not started at index 0 have completed a so-called full rotation and are removed from the array. A sequence has completed a full rotation when the sequence has been applied to each element in the array. In this example a full rotation has been completed when the sequence has been applied to each one of the 64 DAC elements in the array. After this point, operation with full sequences can begin again and the next PWM sequence, S10 is inserted at index 0 without being truncated (clock 96, DAC element 0). The maximum number of samples required to complete the transition to full-scale operation depends on the implementation. In the case illustrated in FIG. 11 with 16-bit PWM sequences and 64 FIR taps a maximum of seven samples is required. For more FIR taps, the point in time at which samples should begin to appear at element 0 may be different and more samples may be required before the transition has been fully completed. Additionally, one or more additional insertion points may be required in order to prevent rotated PWM sequences from colliding in the array (for example one sequence rotating around from the last bit while another is trying to be inserted at bit 0).

Figure 12A:
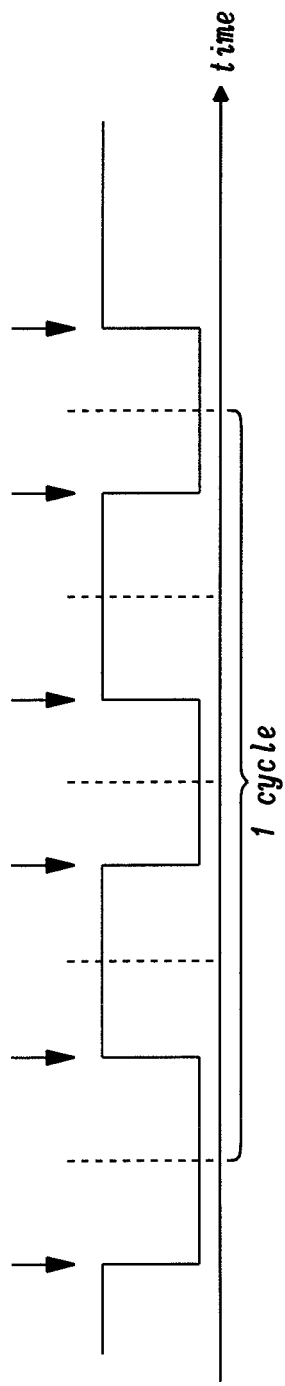
FIG. 12A is a diagram illustrating the working of a single DAC element in the normal power mode.
Figure 12B:
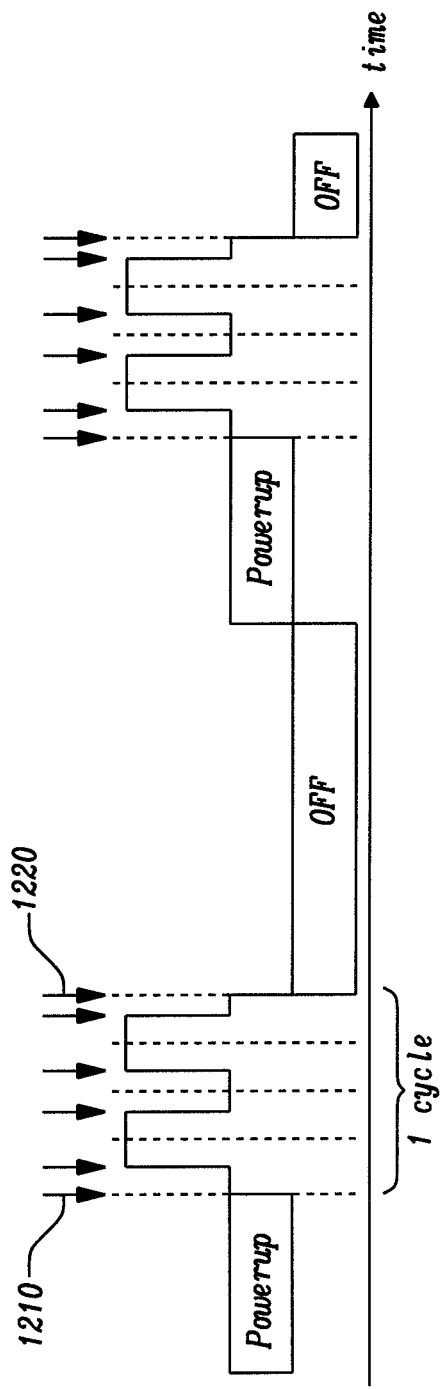
FIG. 12B is a diagram illustrating the working of a single DAC element in the low power mode.

FIG. 12A shows the output of a single DAC element as a function of time when operating in the normal mode. FIG. 12B is a diagram illustrating the workings of a single DAC element operating in the low power mode. Each arrow indicates a switching event of the single DAC element. When the PWM DAC is operating in normal mode (FIG. 12A), the average number of DAC elements that switch at each cycle is independent of the signal level of the digital input, hence the switching of the single DAC elements does not contribute to non-linear errors. When the PWM DAC is operating in low power mode (FIG. 12B), each single DAC element switches two additional times in each cycle as compared to the normal mode, since it needs to power on and off as shown by the arrows referenced 1210 and 1220 respectively in FIG. 12B. However, the average number of switching events in each cycle is still constant and independent on the signal level, therefore the extra switching might contribute to offset and gain errors, but it will not affect the linearity of the PWM DAC. On the contrary, when transitioning from the normal mode to the low power mode, or vice versa, the average number of switching events at each cycle changes. This might result in a small artefact at the output when entering and exiting the low power mode, but with proper design this effect can be made inaudible.

The method illustrated with reference to FIGS. 9, 10 and 11 permits to lower the power consumption in PWM DACs by dynamically powering cells on and off when there are redundant bits in the PWM sequences. The number of DAC cells that must be turned on at any given time depends on how quickly they can be powered up. Depending on the number of taps in the FIR filter, this may mitigate the power savings of turning off DAC elements; the design would still however, retain the benefits of disconnecting noise sources from the output.

Assuming that 50% of the DAC cells in an IDAC can be powered down, as shown in FIGS. 9, 10 and 11, IDACs could achieve a power reduction of 87.5%.

Figure 13:
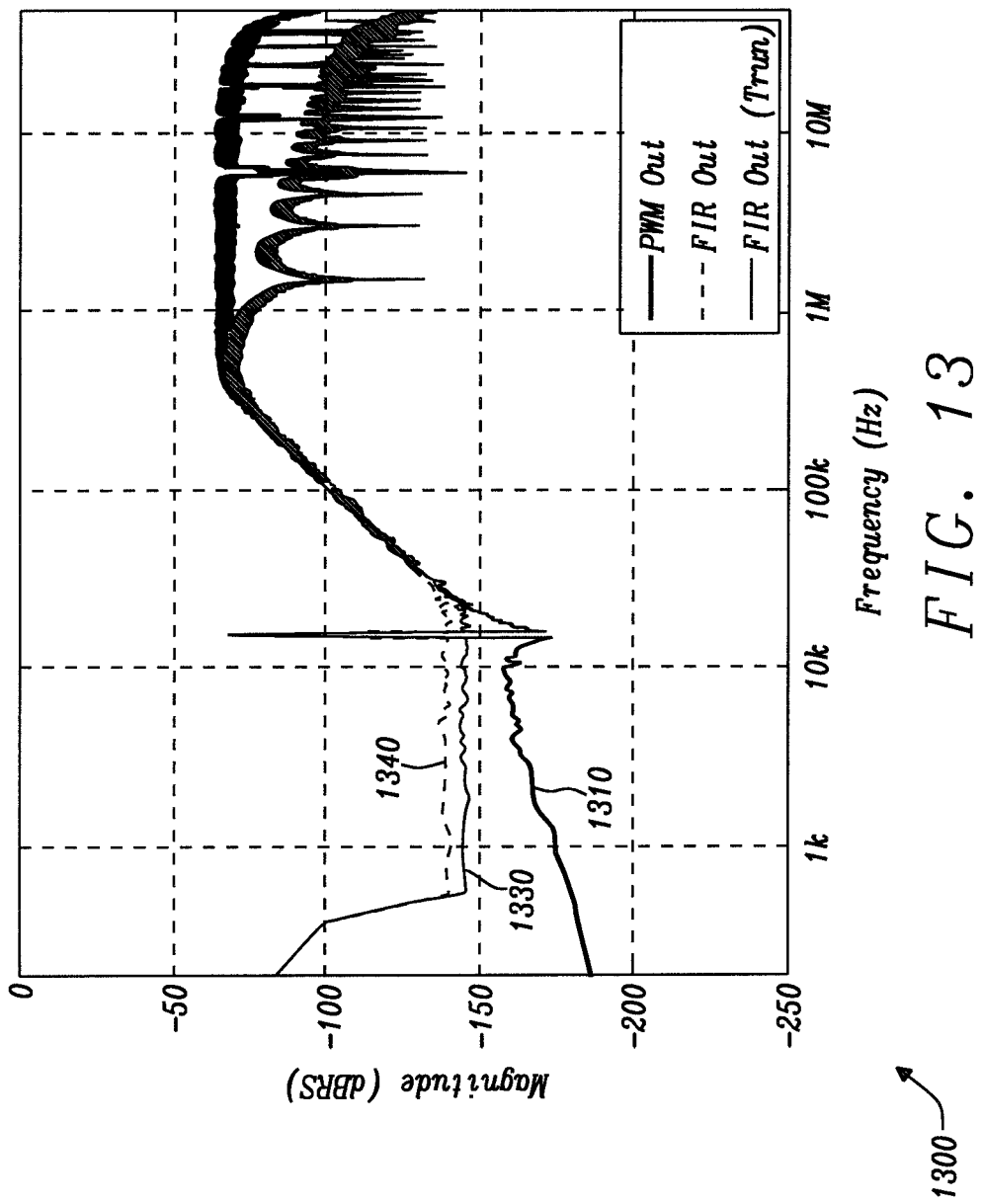
FIG. 13 is a simulation of a current-mode DAC operated with and without the method according to FIG. 2.

FIG. 13 is a simulation of a current-mode DAC operated with and without the method according to FIG. 2. The simulated device is a current-mode DAC with 64 FIR taps and identical PDAC and NDAC cells, including their random noise values. FIG. 13 shows three amplitude signals 1310, 1330, 1340, in decibels relative to full scale (dBFS) as a function of frequency. The signal 1310 simulates the DPWM output. The signal 1330 simulates the DAC output when operating using the method of FIG. 2. The signal 1340 simulates the DAC output when operating without implementing the method of FIG. 2. The DAC is receiving a 16-bit PWM sequence for each $\Sigma\Delta M$ sample and is operated according to the method of FIG. 2, assuming 50% of the IDAC cells can be powered down, as shown in the FIGS. 9, 10 and 11. The large bump at low frequencies is the DC offset (after windowing) caused by element switching errors which are present with and without truncation. At low frequency between about 0.6 KHz to about 40 KHz, the level of the signal 1330 is lower than the level of the signal 1340. This indicates that when the method of the disclosure is implemented the noise level in the signal is reduced by about 6 dB.

Figure 14:
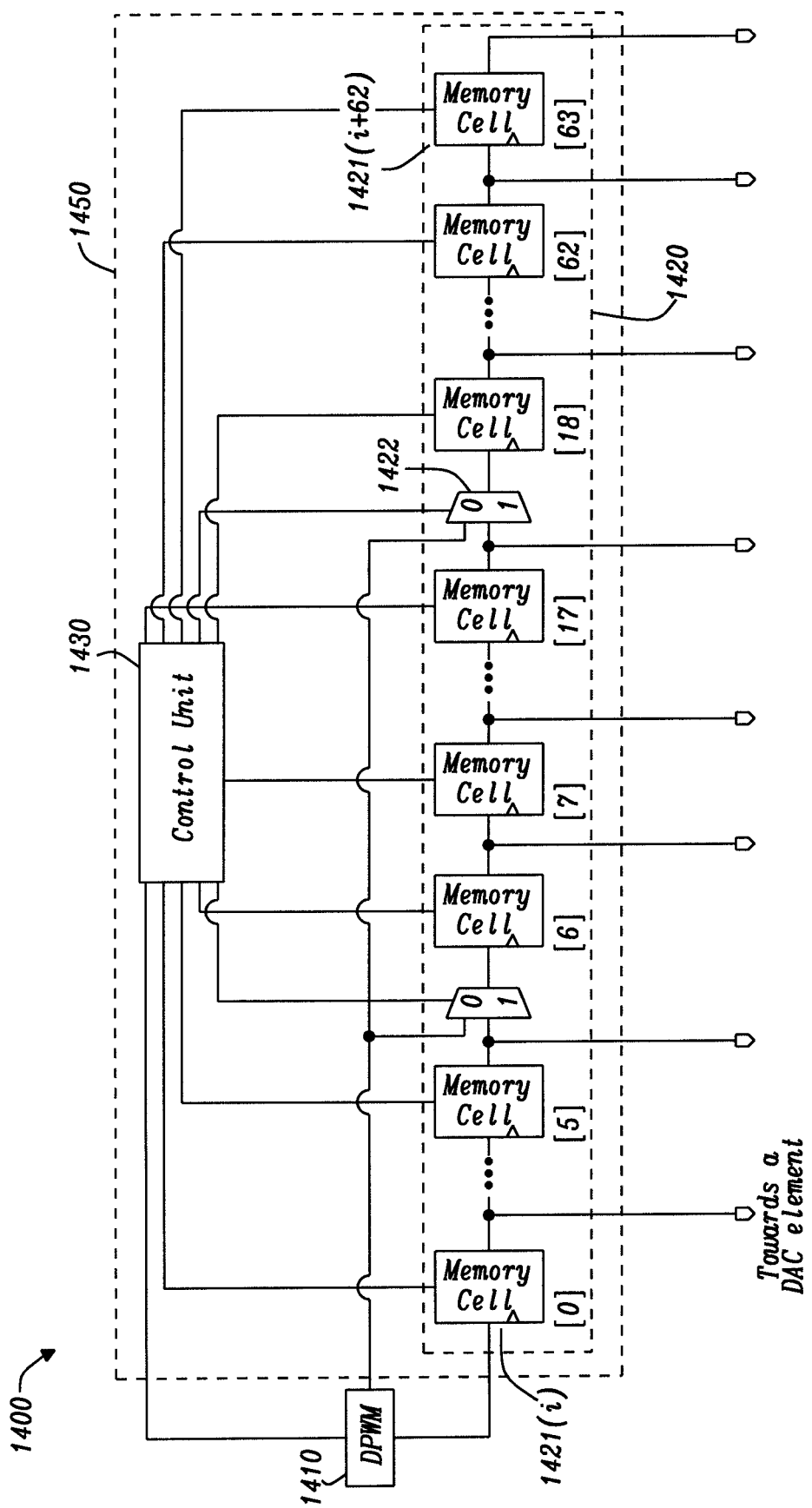
FIG. 14 is an exemplary embodiment of a controller system for use in the circuit of FIG. 3, 4 or 5.

FIG. 14 is a diagram of an exemplary control system 1400 that may be implemented in the circuit of FIGS. 4 and 5 described above. The control system 1400 includes a DPWM 1410 coupled to a controller 1450 provided with an array 1420 of memory cells and a control unit 1430. The array of memory cells 1420 comprises a plurality of memory cells 1421(*i*) coupled in series and a number of multiplexers 1422 placed at specific locations in the array.

The memory cells may be implemented as flip-flops and the number of memory cells may be chosen to match the number of DAC elements present in the DAC. The number of multiplexers may vary depending on the application. For instance, if the DAC includes 64 DAC elements, 64 memory cells could be used with four multiplexers.

Each memory cell has a data input for receiving a digital value, a clock input coupled to the control unit 1430 and an output coupled to a corresponding DAC element. The first DAC 1421*i* in the array 1420 has its data input coupled to the output of the DPWM 1410. The second memory cell has its data input coupled to the output of the first memory cell and so on.

Each multiplexer 1422 has a first input coupled to the DPWM 1410, a second input coupled to the output of a DAC element in the series, a selection input for receiving a selection signal from the control unit 1430 and one output coupled to the data input of a subsequent memory cell. The control unit 1430 is configured to generate a plurality of clock signals to clock the memory cells and a plurality of control signals also referred to as selection signal to select a particular channel of a multiplexer.

The controller system 1400 may operate the DAC either in a normal mode or in a low power mode. In the normal mode each DPWM sequence is passed from the DPWM 1410 to the first DAC 1421*i* and shifts through the array 1420 passing through all the memory cells 1421. In the low power mode the control unit 1430 determines at which insertion point the DPWM sequence should be inserted and instructs the corresponding multiplexer 1422 to select the DPWM input instead of the output coming from the previous DAC unit. The system 1400 may be used to apply a plurality of sequences to a specific set of DAC elements as described in FIGS. 9, 10 and 11.

FIG. 15 illustrates an audio device 1510 that includes a DAC circuit 300 as described in FIG. 3 above. The DAC circuit 300 receives a digital signal and provides an analog signal to drive a speaker 1512.

In conclusion a method and associated system has been proposed to achieve power savings in PWM DACs by truncating PWM sequences and maximizing the amount of time available to powerup a DAC cell without sacrificing sensitivity to element mismatch.

A skilled person will appreciate that variations of the disclosed arrangements are possible without departing from the disclosure. Although the DAC circuit of the disclosure has been described in the context of the amplification of an audio signal, it will be appreciated that such a system and method may be used with other types of applications. Accordingly, the above description of the specific embodiment is made by way of example only and not for the purposes of limitation. It will be clear to the skilled person that minor modifications may be made without significant changes to the operation described.

What is claimed is:

1. A method of converting a digital signal into an analog signal, the method comprising
   providing a digital-to-analog converter comprising an array of digital-to-analog elements operable over several time steps, each digital-to-analog element being adapted to convert a digital value into an analog value in each time step;
   generating a plurality of drive sequences to drive the array of digital-to-analog elements based on the digital signal, and
   upon identifying that the digital signal is below a threshold value
   shortening the drive sequences; and for each time step
   identifying a first set of elements and a second set of elements among the array of digital-to-analog elements;
   applying the shortened drive sequences to the first set;
   disabling the second set; and
   shifting the first set and the second set by one element.

2. The method as claimed in claim 1, wherein the shortened drive sequences are concatenated.

3. The method as claimed in claim 1, comprising sampling the digital signal to obtain a series of digital samples; and modulating each digital sample to generate the plurality of drive sequences.

4. The method as claimed in claim 1, wherein disabling the second set comprises powering off the digital-to-analog elements of the second set.

5. The method as claimed in claim 1, wherein the digital-to-analog elements are selectively connected to an output of the converter; the method comprising identifying a third set of elements and disconnecting the third set from the output; and for each time step shifting the third set by one element.

6. The method as claimed in claim 5, wherein the third set is powered off.

7. The method as claimed in claim 6, comprising powering up the third set at a predetermined time before reconnecting the third set to the output.

8. The method as claimed in claim 1, comprising applying a sequence of predefined values to a predetermined set of elements for a predefined number of time steps.

9. The method as claimed in claim 5, wherein elements in the first set, second set and third set are provided in a successive order respectively.

10. The method as claimed in claim 1, wherein the digital-to-analog converter is a differential digital-to-analog converter and wherein the array of digital-to-analog elements comprises a first group of digital-to-analog elements and a second group of digital-to-analog elements coupled to a summation stage.

11. The method as claimed in claim 10, wherein the first group is configured to receive a first plurality of drive sequences and the second group is configured to receive a second plurality of drive sequences, the second plurality of drive sequences being identical to the first plurality of drive sequences with opposite sign.

12. The method as claimed in claim 11, wherein the first plurality of drive sequences and second plurality of drive sequences form a plurality of differential drive sequences, each differential drive sequence comprising a set of values, each value being either a plus one state, a zero state or a minus one state; wherein shortening the drive sequences comprises identifying a shortening portion of the sequence that consists of at least one zero state.

13. The method as claimed in claim 1, wherein the first set of elements comprises an opening element having a predefined location within the array.

14. The method as claimed in claim 13, wherein upon identifying that the digital signal has increased above a normal mode threshold value:
enabling previously disabled elements;
setting the predefined location of the opening element to be the first element in the array of digital-to-analog elements;
and
stop shortening the drive sequences.

15. The method as claimed in claim 14, comprising applying a sequence of predefined values to predefined elements.

16. The method as claimed in claim 1, wherein the digital-to-analog elements are one-bit elements.

17. The method as claimed in claim 1, wherein the digital-to-analog elements comprise current digital-to-analog converter elements.

18. A digital to analog circuit comprising
a driver adapted to receive a digital signal and to provide a plurality of drive sequences;
a digital-to-analog converter comprising an array of digital-to-analog elements operable over several time steps, each digital-to-analog element being adapted to convert a digital value into an analog value in each time step; and
a controller coupled to the driver and to the digital to analog converter;
wherein upon identifying that the digital signal is below a threshold value, the controller is configured to
shorten the drive sequences; and for each time step
to identify a first set of elements and a second set of elements among the array of digital-to-analog elements;
to apply the shortened drive sequences to the first set;
to disable the second set; and
to shift the first set and the second set by one element.

19. The circuit as claimed in claim 18, wherein the digital-to-analog converter is a differential digital-to-analog converter comprising a first group of 1-bit elements and a second group of 1-bit elements coupled to a summation stage.

20. The circuit as claimed in claim 18, wherein the driver comprises a first pulse-width modulator adapted to provide a first plurality of drive sequences and a second pulse-width modulator adapted to provide a second plurality of drive sequences.

21. The circuit as claimed in claim 18, wherein each digital-to-analog element is coupled to an output of the converter via a disconnection switch.

22. The circuit as claimed in claim 18, wherein the controller comprises a plurality of memory devices coupled to one or more multiplexers, each memory device being associated with a corresponding digital-to-analog element.

23. The circuit as claimed in claim 18 comprising a sampler for sampling the digital signal.

24. An audio device comprising a digital to analog circuit as claimed in claim 18.

* * * * *